United States Patent
Won

(10) Patent No.: US 7,084,056 B2
(45) Date of Patent: Aug. 1, 2006

(54) ELECTRICAL INTERCONNECTION, METHOD OF FORMING THE ELECTRICAL INTERCONNECTION, IMAGE SENSOR HAVING THE ELECTRICAL INTERCONNECTION AND METHOD OF MANUFACTURING THE IMAGE SENSOR

(75) Inventor: Seok-Jun Won, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/879,076

(22) Filed: Jun. 30, 2004

(65) Prior Publication Data

US 2005/0001318 A1   Jan. 6, 2005

(30) Foreign Application Priority Data

Jul. 1, 2003   (KR) ............... 10-2003-0044099

(51) Int. Cl.
*H01L 21/4763* (2006.01)
*H01L 21/44* (2006.01)

(52) U.S. Cl. .............. 438/627; 438/634; 438/687; 438/653; 438/654; 257/E21.584

(58) Field of Classification Search ........ 438/622, 438/627, 634, 687, 700, 653, 654; 257/758, 257/E21.584, 767
See application file for complete search history.

(56) References Cited

U.S. PATENT DOCUMENTS 5,783,483 A * 7/1998 Gardner ............... 438/627
6,319,814 B1   11/2001 Tsai et al.
6,376,353 B1 * 4/2002 Zhou et al. ............ 438/612
6,521,523 B1 * 2/2003 Lee et al. ............... 438/633
6,632,700 B1 * 10/2003 Fan et al. ............... 438/70
2003/0111730 A1 * 6/2003 Takeda et al. .......... 257/758

FOREIGN PATENT DOCUMENTS

| JP | 2001-135592 | 5/2001 |
| KR | 2001-0077260 | 8/2001 |
| KR | 2002-0055309 | 7/2002 |

OTHER PUBLICATIONS

Kuo, et al., Thin Solid Films, 398-399 (2001) 35-40 Entitled. Growth and properties of alumina films obtained by low-pressure metal-organic chem vapor deposition.

Zhang et al. NanoStructured Materials, vol. 8, No. 2, pp. 191-197, (1997) Entitled.

Analysis of Transmittance of Nanostructured Alumina Films.

* cited by examiner

*Primary Examiner*—Nitin Parekh
(74) *Attorney, Agent, or Firm*—Lee & Morse, P.C.

(57) ABSTRACT

An electrical interconnection for a highly integrated semiconductor device includes a first insulation layer having at least a first recessed portion on a substrate. The first recessed portion is filled with metal to form a first metal pattern. A diffusion barrier layer including aluminum oxide of high light transmittance is provided on the first insulation layer and the first metal pattern for preventing metal from diffusing. An insulating interlayer including a second recessed portion for exposing an upper surface of the first metal pattern is provided on the diffusion barrier layer. The second recessed portion is filled with metal to form a second metal pattern. The electrical interconnection may be used with an image sensor. The metal may be copper. High light transmittance of the diffusion barrier layer ensures external light reaches the photodetector. The aluminum oxide of the diffusion barrier layer reduces parasitic capacitance of the electrical interconnections.

20 Claims, 16 Drawing Sheets

ELECTRICAL INTERCONNECTION, METHOD OF FORMING THE ELECTRICAL INTERCONNECTION, IMAGE SENSOR HAVING THE ELECTRICAL INTERCONNECTION AND METHOD OF MANUFACTURING THE IMAGE SENSOR

BACKGROUND OF THE INVENTION

1. Field of the Invention

The present invention relates to an electrical interconnection and a method of forming the electrical interconnection, and to an image sensor having the electrical interconnection and a method of manufacturing the image sensor. More particularly, the present invention relates to an electrical interconnection of copper and a method of forming the electrical interconnection, and to a complementary metal oxide semiconductor (CMOS) image sensor having the electrical interconnection of copper and a method of manufacturing the CMOS image sensor.

2. Description of the Related Art

The availability and use of information media and equipment for processing information media, e.g., computers, has been steadily increasing. Components using semiconductor technology are under pressure to keep pace with these developments. These developments require semiconductor devices that operate at a high speed and having a large storing capacitance. As a result, semiconductor technology is continuously striving to improve integration, reliability and response speed of semiconductor devices.

Generally, a semiconductor device includes a great number of transistors, resistors and capacitors. A semiconductor device needs interconnections for electrically connecting the transistors, the resistors and the capacitors. Electrical interconnections transmit an electrical signal, and numerous such electrical interconnections are required for a semiconductor device. Thus, electrical interconnections need to have low electrical resistance, low cost and high reliability. As semiconductor devices become more highly integrated, the width and thickness of the electrical interconnections and the size of a contact hole through which the electrical interconnections extend are correspondingly reduced. Therefore, a design rule of a semiconductor device is also reduced accordingly, as a pattern size shrinks. The resulting reduced feature size increases the difficulty of forming electrical interconnections on a semiconductor substrate.

The increased difficulty in forming wirings imposes strict requisites on a metal layer forming electrical interconnections on the substrate. To meet these needs, metal layers have been coated to be a multi-layer structure so as to increase the degree of integration of the semiconductor device. In general, aluminum (Al) or tungsten (W) has been widely used for coating the metal layer. However, aluminum and tungsten have high specific resistances of $2.8 \times 10^{-8}$ $\Omega$m and $5.5 \times 10^{-8}$ $\Omega$m, respectively, and thus are not suitable for a multi-layer structure. Recently, copper (Cu), which has low specific resistance and a good electro-migration characteristic, has replaced aluminum and tungsten in forming a metal multi-layer.

However, Cu has a high rate of diffusion with respect to silicon or silicon oxide. Therefore, a barrier metal layer and a diffusion barrier layer are required for preventing diffusion of Cu into the substrate. The barrier metal layer is coated on side and lower surfaces of a copper pattern, and the diffusion barrier layer is coated on an upper surface of the copper pattern.

A reactive ion etching (RIE) process is difficult to perform on copper, so a damascene process is used to form a copper pattern. In the damascene process for forming the copper pattern, the diffusion barrier layer functions as a stop layer of an etching process. The diffusion barrier layer usually includes silicon nitride, which has a high etching selectivity relative to an insulation interlayer and is good at preventing Cu diffusion. In general, silicon nitride is deposited to a thickness of about 300 Å to 1000 Å in order to prevent the Cu from diffusing and to ensure that the copper layer properly functions. However, silicon nitride has a dielectric constant of about eight. This high dielectric constant increases a parasitic capacitance between wirings, thereby reducing a response time of the signal.

Recently, Cu wiring has been used as wiring in optoelectronic devices, e.g., a complementary metal oxide semiconductor (CMOS) image sensor (hereinafter, "CIS").

A CIS transforms optical images into electrical signals utilizing the CMOS technology. A recent dramatic increase in demand for digital image devices, e.g., in digital still cameras and cameras incorporated into mobile phones, door phones and so on, has given rise to an enormous demand for CISs. Furthermore, CISs have been improved to have higher performance, as the variety of CIS applied products increases. For example, a CIS is currently manufactured under a design rule of 0.18 µm, and is expected to be manufactured under a design rule of 0.13 µm in the near future.

When a CIS is manufactured under a design rule of 0.13 µm or below, using aluminum to form electrical interconnections of a CIS will be difficult. Thus, copper will be used to form electrical interconnections of a CIS manufactured under a design rule of 0.13 µm or below. As noted above, when a copper pattern is formed by the damascene process, a diffusion barrier layer of silicon nitride is required for stopping an etching process and preventing diffusion of copper, as described above. However, silicon nitride is highly absorptive of light. Thus, a certain amount of light is absorbed into the diffusion barrier layer, thereby preventing light from reaching a detector of the image sensor. Therefore, the silicon nitride diffusion barrier layer is a critical weak point of a CIS having a photodetector for detecting external light.

Table 1 shows an experimental light absorption percentage of silicon nitride according to a thickness of the silicon nitride layer and wavelengths of light at 400 (nm) and 500 (nm).

TABLE 1

| thickness (nm) | Wavelength 400 (nm) light absorption | wavelength 500 (nm) light absorption |
|---|---|---|
| 40 | 8% | 3% |
| 80 | 16% | 6% |
| 120 | 23% | 9% |
| 160 | 30% | 12% |
| 200 | 36% | 15% |
| 240 | 41% | 18% |
| 280 | 46% | 20% |
| 320 | 51% | 23% |
| 360 | 55% | 25% |

A CIS including copper wirings requires at least a silicon nitride layer as the diffusion barrier layer on each wiring layer. For example, when the diffusion barrier layer is formed of six-layers of silicon nitride, each having a thickness of about 500 Å, the overall thickness of the diffusion barrier layer is about 3,000 Å. As can be seen in Table 1, as much as about 48% of external light incident on the silicon nitride diffusion barrier layer will be absorbed. That is, almost half of the supplied light is absorbed into the diffusion barrier layer. Such absorbed light will not reach the photodetector, which is at a lower portion of the CIS, thereby causing an operation failure.

SUMMARY OF THE INVENTION

The present invention is therefore directed to an electrical interconnection and a method of manufacture thereof, and an image sensor and a method of manufacture thereof, which substantially overcome one or more of the problems due to the limitations and disadvantages of the related art.

It is a feature of the present invention to provide an electrical interconnection with reduced parasitic capacitance. It is another feature of the present invention to provide a method of forming the electrical interconnection having reduced parasitic capacitance.

It is yet another feature of the present invention to provide an image device including an electrical interconnection having reducing parasitic capacitance. It is still another feature of the present invention to provide a method of manufacturing the image device including an electrical interconnection having reduced parasitic capacitance using a reduced design rule, e.g., at or below about 0.13 µm.

At least one of the above and other features and advantages of the present invention may be realized by providing an electrical interconnection including a first insulation layer formed on a substrate, a first metal pattern, a first diffusion barrier layer formed on the first insulation layer and the first metal pattern, a second insulation layer formed on the diffusion barrier layer, and a second metal pattern. The first insulation layer includes at least a first recessed portion, and the first metal pattern fills the first recessed portion. The first diffusion barrier layer prevents the diffusion of a metal material of the first metal pattern. The second insulation layer includes at least a second recessed portion that exposes an upper surface of the first metal pattern, and the second metal pattern fills the second recessed portion.

At least one of the above and other features and advantages of the present invention may be realized by providing a method of forming an electrical interconnection including forming a first insulating layer on a semiconductor substrate such that at least a first recessed portion is formed therein. Then, the first recessed portion is filled with metal to form a first metal pattern. A first diffusion barrier layer is then formed on the first metal pattern and the first insulation layer. The first diffusion barrier layer includes a metal oxide, and prevents the diffusion of metal out of the first metal pattern. Next, a second insulation layer is formed on the first diffusion barrier layer such that the second insulation layer includes at least a second recessed portion exposing a portion of the first metal pattern. The second recessed portion is filled with metal, thereby forming a second metal pattern.

At least one of the above and other features and advantages of the present invention may be realized by providing an image device including a substrate, an insulating interlayer structure, a plurality of metal patterns, a plurality of diffusion barrier layers including aluminum oxide, a color filter, and a lens. A semiconductor device including an optoelectronic device is disposed on the substrate. The insulating interlayer structure includes a plurality of insulating interlayer patterns stacked therein, and each of the insulating interlayer patterns includes at least a recessed portion. Metal patterns fill the recessed portions and make electrical contact with each other. The diffusion barrier layer is disposed on boundary surfaces between the insulating interlayer patterns and between a metal pattern and an adjacent insulating interlayer. The diffusion barrier layer prevents the diffusion of metal of the metal pattern. The color filter is disposed on the insulating interlayer structure, and the lens is disposed on the color filter.

At least one of the above and other features and advantages of the present invention may be realized by providing a method of manufacturing an image device. A semiconductor device including an optoelectronic device is formed on the semiconductor substrate. Next, a lower insulation layer including a first metal pattern is formed on the semiconductor substrate and is electrically connected with the semiconductor device. A lower diffusion barrier layer is formed on the lower insulation layer. The lower diffusion barrier layer includes a metal oxide, and prevents metal of the first metal pattern from diffusing out of the first metal pattern. At least one insulating interlayer is formed on the lower insulation layer such that the insulating interlayer includes at least a recessed portion. The recessed portion is filled with metal to thereby form a second metal pattern. An upper diffusion barrier layer is formed between the second metal pattern and the insulating interlayer. The upper diffusion barrier layer includes a metal oxide and prevents metal of the second metal pattern from diffusing out of the second metal pattern. A color filter is formed on the upper diffusion barrier layer, and a lens is formed on the color filter.

According to a feature of an embodiment of the present invention, the diffusion barrier layer of metal oxide is superior to the conventional diffusion barrier layer of silicon nitride, as it provides good diffusion prevention, provides excellent etching selectivity with respect to silicon oxide, and allows a thickness of the diffusion barrier layer to be reduced. In addition, the diffusion barrier layer of metal oxide provides good light transmittance, thus minimizing light shielding of the diffusion barrier layer, and thereby improving the light sensitivity of the device.

BRIEF DESCRIPTION OF THE DRAWINGS

The above and other features and advantages of the present invention will become readily apparent to those of ordinary skill in the art by reference to the following detailed description when considered in conjunction with the accompanying drawings, in which.

DETAILED DESCRIPTION OF THE INVENTION

Figure 1:
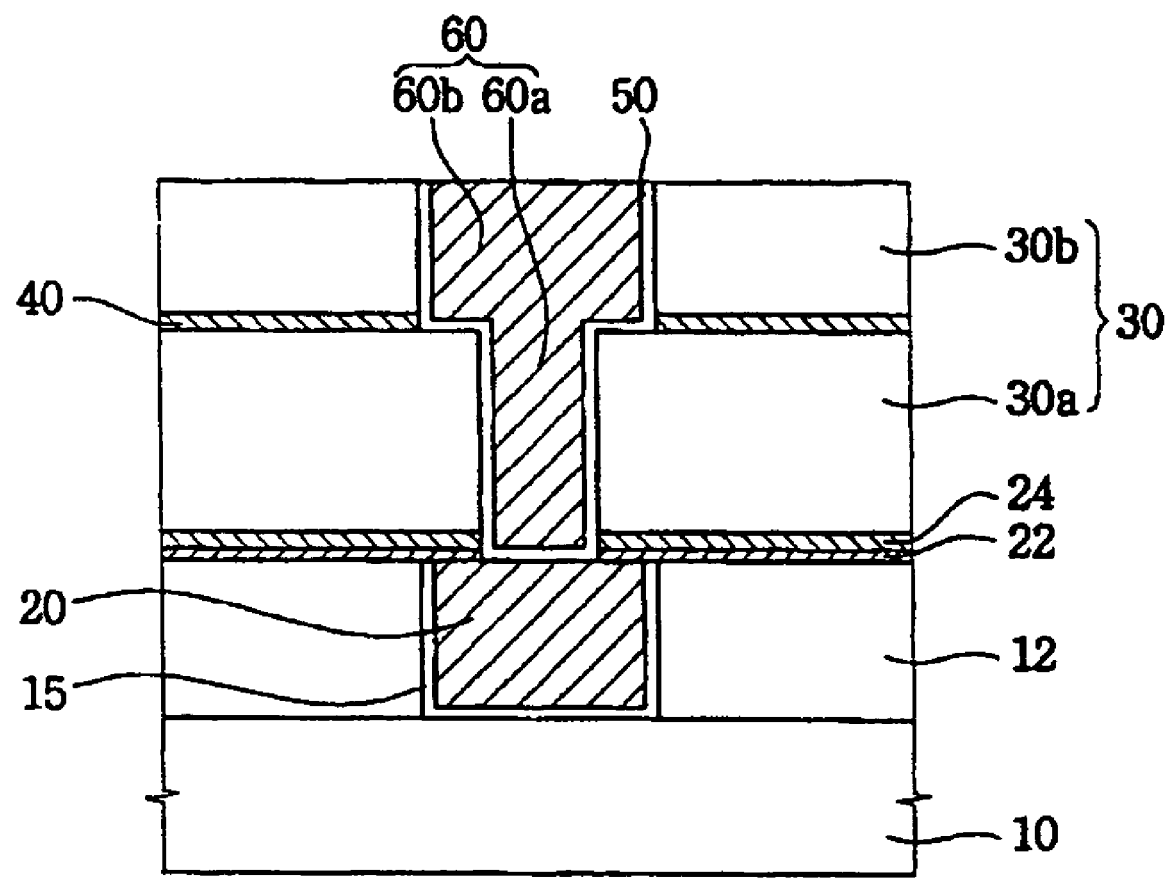
FIG. 1 illustrates a cross-sectional view of an electrical interconnection according to an embodiment of the present invention.

Korean Patent Application No. 2003-44099, filed on Jul. 1, 2003, in the Korean Intellectual Property Office, and entitled: "Metal Wiring, Method of forming the Metal Wiring, Image Sensor Having the Metal Wiring and Method of Manufacturing the Image Sensor," is incorporated by reference herein in its entirety.

The present invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like reference numerals refer to similar or identical elements throughout. It will be understood that when an element such as a layer, region or substrate is referred to as being "on" or "onto" another element, it can be directly on the other element or intervening elements may also be present.

FIG. 1 illustrates a cross-sectional view of an electrical interconnection according to an embodiment of the present invention.

Referring to FIG. 1, a semiconductor substrate 10 has an active region defined thereon by a field oxide (not shown). A first insulation layer 12 including at least a first recessed portion such as a hole or a trench is formed on the substrate 10. The hole or trench is filled with metal to thereby form a first metal pattern 20. The first metal pattern 20 may include copper.

A first barrier metal layer 15 may be coated on side and bottom surfaces of the first metal pattern 20 when necessary. For example, when the first metal pattern 20 includes titanium, the first barrier metal layer 15 is not needed; however, when the first metal pattern 20 includes tungsten or copper, the first barrier metal layer 15 is required so as to prevent the tungsten or copper from diffusing into the first insulation layer 12. In this embodiment, the first metal pattern 20 includes copper, and the first barrier metal pattern 15 includes titanium, nitride or tantalum nitride.

A first metal anti-oxidation layer 22 including a silicon nitride layer is provided on the first insulation layer 12 and the first metal pattern 20. The thickness of the first metal anti-oxidation layer 22 may be no more than about 30 Å.

A first diffusion barrier layer 24 is provided on the first metal anti-oxidation layer 22 to prevent copper diffusion. The first diffusion barrier layer 24 may act as an etch stop layer in the following etching process. The first diffusion barrier layer 24 may include a transparent insulation material having a good etching selectivity with respect to silicon oxide and an excellent light transmittance. The first diffusion barrier layer 24 may include a metal oxide, e.g., aluminum oxide ($Al_2O_3$). The first diffusion barrier layer 24 may be formed to have a thickness of about 100 Å to about 500 Å, e.g., about 200 Å to about 300 Å.

When the first diffusion barrier layer 24 is provided using an atomic layer deposition (ALD) process or a deposition process using a source gas including oxygen, the first metal anti-oxidation layer 22 is not needed, since the copper is barely oxidized.

A second insulation layer 30 is disposed on the first diffusion barrier layer 24, and includes at least a second recessed portion for exposing a first metal pattern. The second recessed portion is filled with a metal material to thereby form a second metal pattern 60. In this embodiment, the second metal pattern including copper has a via contact 60a disposed in a lower portion thereof and a trench contact 60b disposed in an upper portion thereof. The via contact 60a makes an electrical contact with the first metal pattern 20, while the trench contact 60b makes contact with the via contact 60a for applying electrical signals to the via contact 60a.

The second insulation layer 30 may be an insulating interlayer formed into a lower layer 30a and an upper layer 30b. The lower layer 30a may include at least a via-hole that exposes a first metal pattern 20, and the upper layer 30b may include at least a trench over the via-hole. The via contact 60a is within the via-hole, and the trench contact 60b is within the trench. In this embodiment, an etch stop layer 40 may be interposed between the lower and upper layers 30a and 30b, and stops the etching process for forming the trench in the upper layer 30b. The etching stop layer 40 may include aluminum oxide having a thickness of about 300 Å to about 1000 Å, e.g., about 500 Å to about 700 Å.

A second barrier metal layer 50 is coated on inner surfaces of the via-hole and trench, so that metal such as copper of the via contact 60a and the trench contact 60b is prevented from diffusing into the second insulation layer 30. The second barrier layer 50 may include titanium nitride or tantalum nitride.

Although not shown in FIG. 1, an insulating interlayer having a structure as described above may be vertically stacked in multi-layers on the first diffusion barrier layer 24, and a plurality of the second metal lines may be sequentially disposed along the stacked insulating interlayer. Each of the second metal lines includes a second via contact extending along a second via-hole and a second trench contact extending along a second trench of each insulating interlayer. The via contact and the trench contact disposed in adjacent insulating interlayers electrically contact one another, so that the electrical connection is maintained through the lines. A second diffusion barrier layer may be interposed between the insulating interlayers, so that metal, e.g., copper, of the metal line is prevented from diffusing into each of the insulating interlayers. In addition, a second anti-oxidation layer may be disposed under the second diffusion barrier layer for preventing the metal line of each insulating interlayer from being oxidized.

According to the embodiment of the electrical interconnection of the present invention, the diffusion barrier layer of the electrical interconnection includes a metal oxide. The diffusion barrier layer of metal oxide possesses good diffusion prevention properties and excellent etching selectivity with respect to silicon oxide, so that the thickness of the diffusion barrier layer may be reduced and the parasitic capacitance may be minimized. Therefore, the diffusion barrier layer of metal oxide provides advantages over a conventional diffusion barrier layer of silicon nitride.

FIGS. 2A to 2G illustrate cross sectional views of stages in a method of forming the electrical interconnection shown in FIG. 1.

Figure 2A:
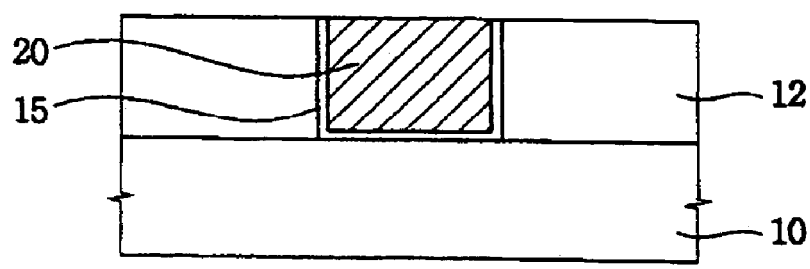
FIGS. 2A to 2G illustrate cross-sectional views of various stages in a method of forming the electrical interconnection shown in FIG. 1.

Referring to FIG. 2A, the first insulation layer 12 is disposed on the semiconductor substrate 10. Then, a portion of the first insulation layer 12 is removed, thereby forming at least a first recessed portion such as a hole or a trench. The first barrier metal layer 15 is provided on an inner surface of the hole or trench. The first barrier metal layer 15 prevents metal from diffusing into the first insulation layer 12 when the hole or trench is filled with metal in a subsequent process. The first barrier metal layer 15 may include titanium nitride or tantalum nitride.

The hole or trench on which the barrier metal layer 15 is coated is filled with metal, thereby forming the first metal pattern 20. In this embodiment, metal is deposited on the first insulation layer 12 to a predetermined thickness and forms a metal layer on the first insulation layer 12 after filling the hole or trench. Then, the metal layer is removed by a planarization process, e.g., an etch back process or a chemical mechanical polishing (CMP) process, so that the metal layer on the first insulation layer 12 is removed and metal only remains in the hole or trench, thereby forming the first metal pattern 20. The planarization process also removes the barrier metal layer to form the barrier metal pattern 15. The first metal pattern may include copper, titanium or tungsten. When the first metal pattern includes titanium, the first barrier metal layer 15 may not be needed.

Figure 2B:
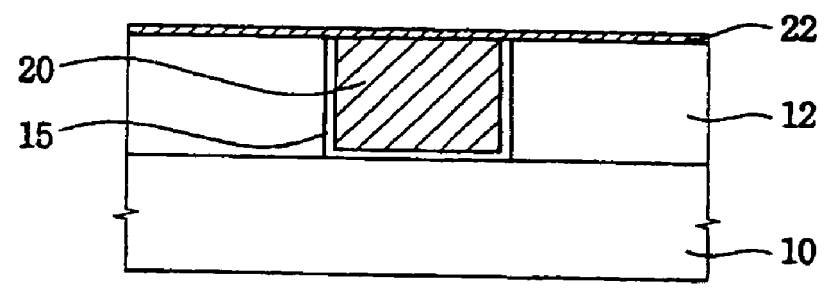

Referring to FIG. 2B, the first anti-oxidation layer 22 is provided on the first insulation layer 12, the first metal pattern 20 and the first barrier metal pattern 15. The first anti-oxidation layer 22 may include silicon nitride or silicon carbide, and prevents the first metal pattern 20 from being oxidized when oxide is supplied in a subsequent process. The first anti-oxidation layer 22 may be provided to a predetermined thickness such that a surface of the first metal pattern 20 is not exposed. For example, the first anti-oxidation layer 22 is provided to a thickness of below about 30 Å.

Figure 2C:
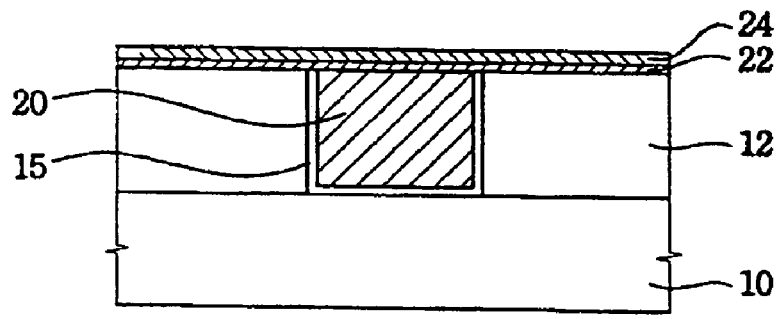

Referring to FIG. 2C, the first diffusion barrier layer 24 is provided on the first anti-oxidation layer 22. The first diffusion barrier layer 24 prevents the first metal pattern 20 from diffusing metal there from or being etched in a subsequent process. The first diffusion barrier layer 24 may include aluminum oxide. In detail, the first diffusion barrier layer 24 stops an etching process for a via-hole in a subsequent process, and prevents metal of the first metal pattern 20 from diffusing into the first insulation layer 12. The first diffusion barrier layer 24 may be provided at a thickness of about 100 Å to about 500 Å, e.g., about 200 Å to about 300 Å. The first diffusion barrier layer may be provided using a physical vapor deposition (PVD) process, a chemical vapor deposition (CVD) process, atomic layer deposition (ALD) or a Sol-Gel process. The ALD process forms an atomic layer at a low temperature layer by layer. When using the ALD process, aluminum atoms are chemisorbed in the first anti-oxidation layer 22 using a first source gas including aluminum, and then, the chemisorbed aluminum is oxidized using a second source gas including oxide, thereby forming an aluminum oxide layer. Since no oxygen gas is used, the ALD process for forming the aluminum oxide layer avoids oxidizing metal in the metal pattern 20. Thus, the first anti-oxidation layer 22 may not be needed. When the aluminum oxide is formed using the CVD process, the first anti-oxidation layer 22 may not be needed, since only a source gas containing oxygen is used in the CVD process, but no reaction gas containing an oxygen gas is used.

The aluminum oxide has excellent etch selectivity with respect to silicon oxide, which constitutes a majority of the second insulation layer to be formed on the first diffusion barrier layer 24, and prevents metal in the metal pattern 20 from diffusing into a neighboring layer.

In a conventional electrical interconnection, the first diffusion barrier layer includes silicon nitride in place of the aluminum oxide. However, the silicon nitride layer needs to be thicker than about 1000 Å in order to prevent the diffusion of the copper and to stop subsequent etching processes. In contrast, an experimental results show that aluminum oxide having a thickness of about 200 Å is sufficient to prevent diffusion of metal and to stop the etching process. Thus, aluminum oxide of an embodiment of the present invention may reduce the thickness of the diffusion barrier layer by up to about 80% of that of a conventional diffusion barrier layer.

A dielectric constant of the aluminum oxide, nitride or silicon carbide is higher than that of the silicon oxide. Therefore, as the thickness of the diffusion barrier layer increases, parasitic capacitance between electrical interconnections increases. This increase in parasitic capacitance significantly reduces a response time of the semiconductor device. However, since the thickness of the diffusion barrier layer may be smaller when using aluminum oxide instead of conventional silicon nitride, the parasitic capacitance between the wirings may be minimized.

Figure 2D:
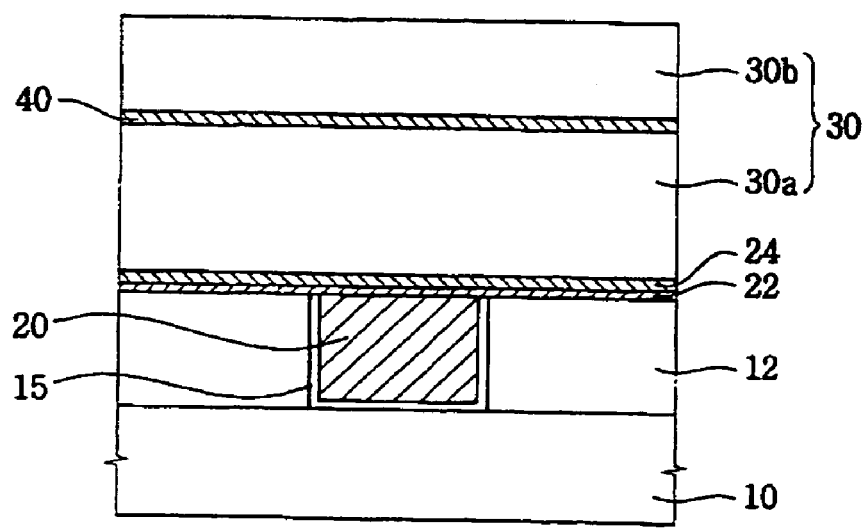

Referring to FIG. 2D, the second insulation layer 30 is disposed on the first diffusion barrier layer 24. As an exemplary embodiment, the second insulation layer 30 includes the insulating interlayer having the lower layer 30a and the upper layer 30b. The lower layer 30a provided on the first diffusion barrier layer 24 includes silicon oxide. Then, the etching stop layer 40 including aluminum oxide is provided on the lower layer 30a, and used for stopping the etching process for forming a trench in the upper layer 30b in a subsequent process. The etching stop layer 40 may be coated to a thickness of about 300 Å to 1000 Å, e.g., to a thickness of about 500 Å to about 700 Å. The upper layer 30b provided on the etching stop layer 40 includes silicon oxide.

The upper layer 30b, the etching stop layer 40 and the lower layer 30a are sequentially etched in that order by a conventional photolithography process, thereby exposing a portion of the first diffusion barrier layer 24 and forming a first space surrounded by the upper layer 30b, the etching stop layer 40 and the lower layer 30b. Next, an etching process is performed on the upper layer 30b neighboring the first space until the etching stop layer 40 is exposed. That is, when the etching stop layer 40 is detected, the etching process for removing the upper layer 30b is stopped, and thus the lower layer 30a is protected from the etching process. Therefore, the lower and upper layers 30a and 30b are formed to have a stepped cross-section, with the second space being wider than the first space. The first diffusion barrier layer 24 has a higher etching selectivity than that of the upper layer 30b, thus the first diffusion barrier layer 24 is barely etched during the etching process for forming the second space. Therefore, the first metal pattern 20 is not exposed in the etching process for forming the second space, thereby protecting the first metal pattern 20 in the etching process.

Figure 2E:
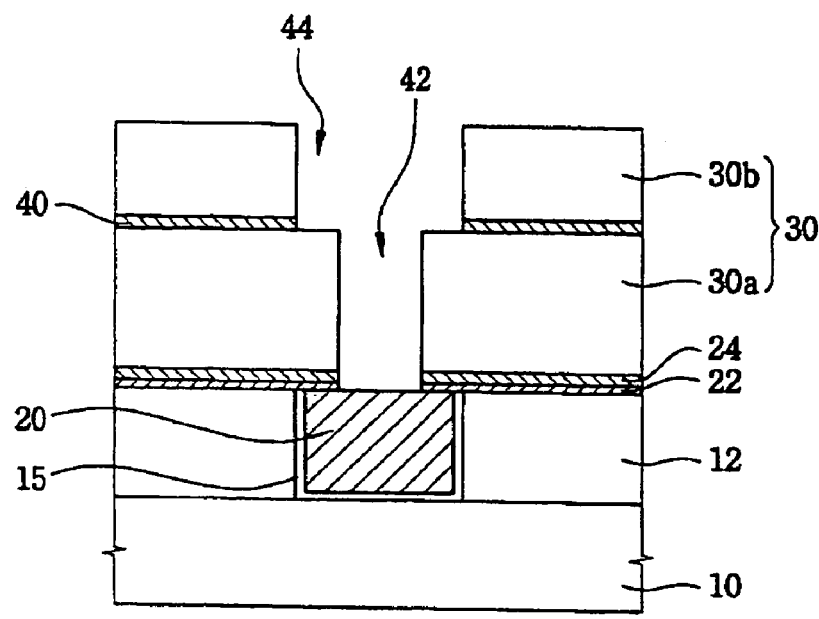

Then, the etching stop layer exposed in the second space and the first diffusion barrier layer 24 exposed in the first space are removed, and the first metal pattern 20 is exposed as shown in FIG. 2E. Therefore, the first space is surrounded by the first metal pattern 20 and the lower layer 30a, and the second space is defined by the lower and upper layers 30a and 30b and is connected to the first space. The first space acts as a first via-hole 42 and the second space acts as a first trench 44. Although the above exemplary embodiments discuss a via-first damascene process in which a via-hole is formed prior to the trench, any other process for forming the via-hole and trench such as a trench-first damascene in which a trench is formed prior to the via-hole may also be utilized in place of the via-first damascene process, as would known to one of the ordinary skill in the art.

Then, a first barrier metal layer 46 is formed on inner surfaces of the first via-hole 42 and the first trench 44. The first barrier metal layer 46 prevents metal, e.g., copper, to be filled in the first via-hole and trench 42 and 44 from diffusing into the second insulation layer 30. The first barrier metal layer 46 may include tantalum nitride or titanium nitride.

Figure 2F:
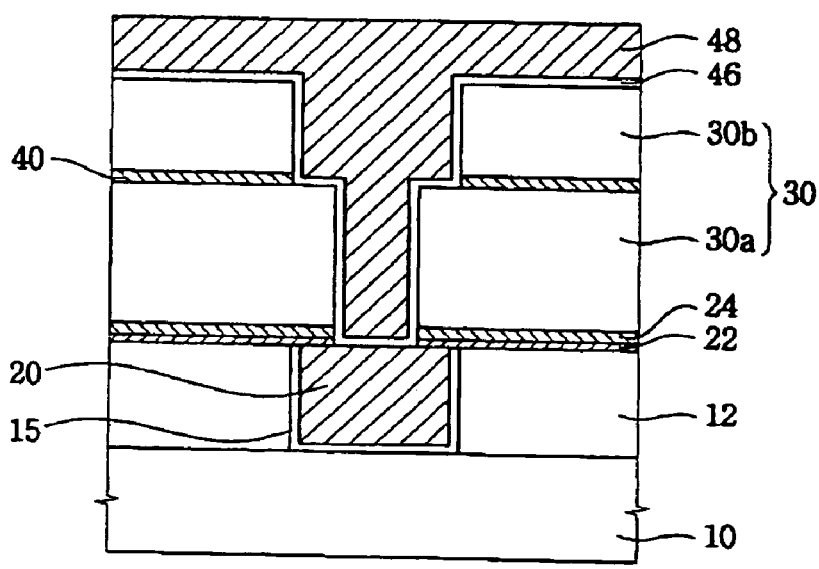

As shown in FIG. 2F, metal is deposited on the upper layer 30b to a predetermined thickness, so that the first via-hole and trench 42 and 44 are filled with metal. As a result, a metal layer 48 is coated on the upper layer 30b. The metal layer may be deposited using an electroplating process after depositing a metal seed by sputtering, or using an electroless plating process.

Figure 2G:
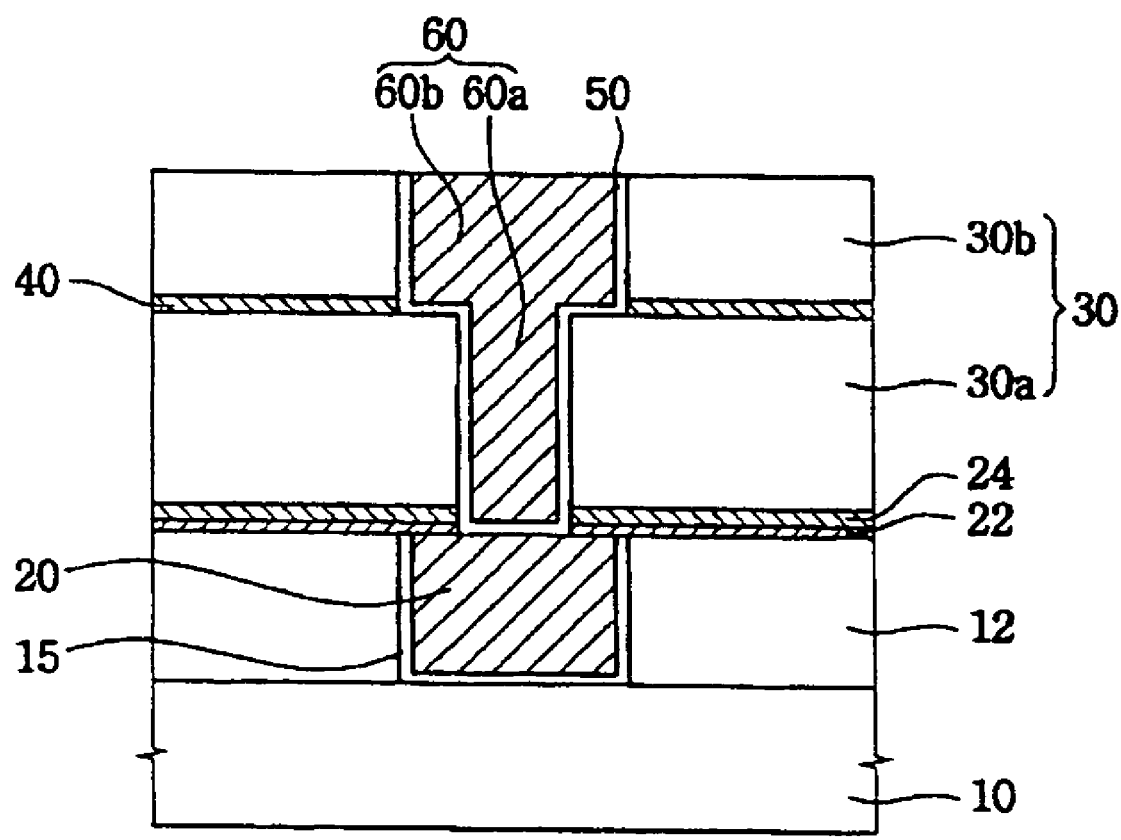

Referring to FIG. 2G, the metal layer 48 and the first barrier metal layer 46 are removed, e.g., using a chemical mechanical polishing (CMP) process. Thus, the upper layer 30b is exposed. Therefore, only the first via-hole 42 and the first trench 44 are filled with metal, thereby forming the second metal pattern 60. The second metal pattern 60 includes the first via contact 60a electrically connected with the first metal pattern 20 and the first trench contact 60b electrically connected with the first via contact 60a and supplying an electrical signal to the first via contact 60a. In addition, the first barrier metal layer 46 remains on side surfaces of the upper and lower layers 30a and 30b and the first metal pattern 20, thereby forming the first barrier metal layer pattern 50.

In this exemplary embodiment, the second insulation layer 30 and the second metal pattern 60 may be vertically stacked thereon by repeating the processes as described above in relation to FIGS. 2B to 2G. Therefore, the second insulation layer 30 may be formed of stacked layers, each of which includes a lower layer and an upper layer, and the second metal pattern may also be formed of stacked patterns individually positioned in every second insulation layer.

Figure 3:
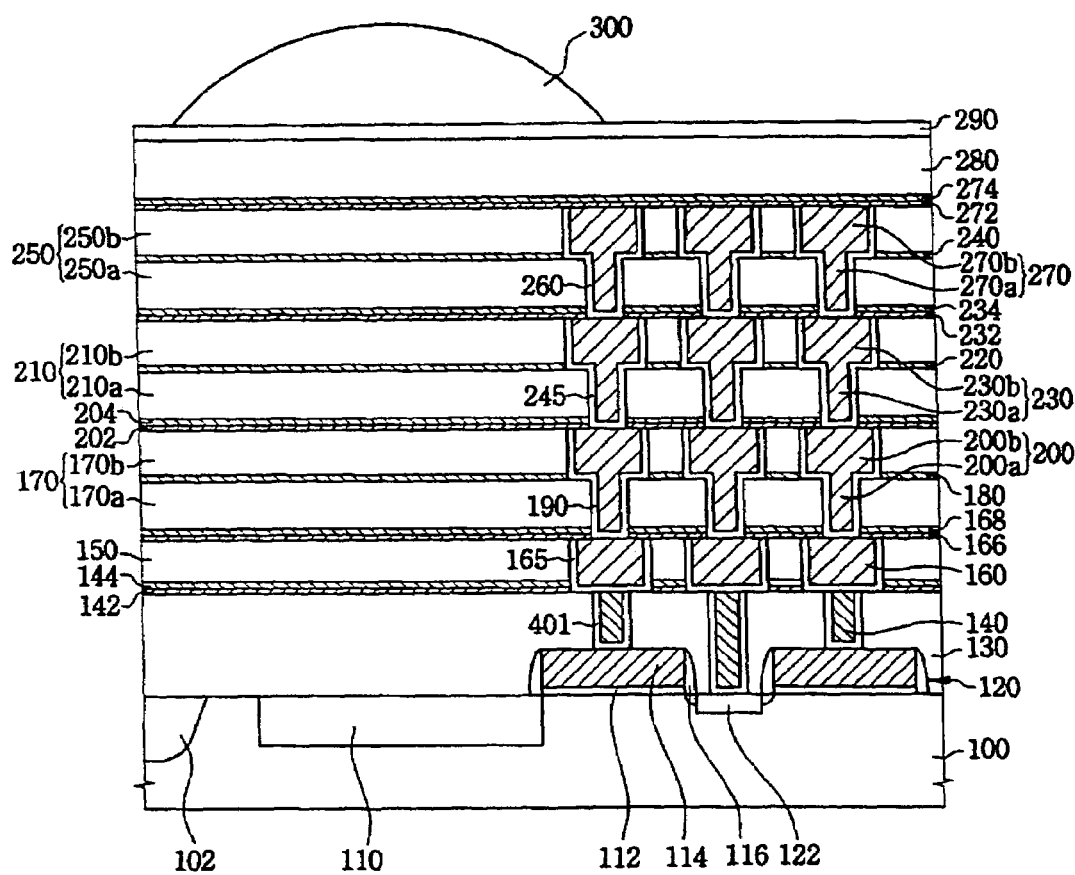
FIG. 3 illustrates a cross-sectional view of an image device according to an embodiment of the present invention.

FIG. 3 illustrates a cross-sectional view of an image device according to an embodiment of the present invention.

Referring to FIG. 3, the image device according to the present invention includes a semiconductor substrate 100 on which an active region defined by a field oxide 102 is provided. A photodetector, e.g., a photodiode 110, is positioned on a surface of the active region of the semiconductor substrate 100. A plurality of transistors 120 is formed on the substrate 100 to serve as a switching device. Each transistor 120 includes a gate electrode 114 and source/drain region 122 disposed between two adjacent gate electrodes 114. A gate insulation layer 112 is disposed between the substrate 100 and the gate electrodes 114. A spacer 116 is formed both sidewalls of the gate electrodes 114.

A lower insulation layer 130 is formed on the semiconductor substrate 100, and covers the transistors 120. The lower insulation layer 130 includes a transparent material such as silicon oxide. The lower insulation layer 130 is selectively removed to thereby form a plurality of openings. A lower contact 140 is positioned in the opening of the lower insulation layer 130. The lower contact 140 is electrically connected to the gate electrode 114 or the source/drain region 122 through the lower insulation layer 130. The lower contact 140 may include metal, e.g., copper (Cu), titanium (Ti) or tungsten (W).

A lower barrier metal layer pattern 401 may be positioned between the lower contact 140 and the lower insulation layer 130 to prevent the material of the lower contact 140 from diffusing into the lower insulation layer 130. The lower barrier metal layer pattern 401 may include titanium nitride or tantalum nitride. When the lower contact 140 includes titanium, the lower barrier metal layer pattern 401 is not needed.

An insulating interlayer structure including a plurality of transparent insulating interlayer is positioned on the lower insulation layer 130. Each insulating interlayer pattern includes at least a recessed portion such as a via-hole and a trench, and metal fills the recessed portions to thereby form a plurality of metal patterns for electrically communicating with the lower contact 140. Each of the metal patterns is individually positioned in each insulating interlayer, and includes a via contact and a trench contact. The via contact and the trench contact in adjacent insulating interlayers are electrically connected with each other, and the metal patterns are electrically connected with each other. A plurality of diffusion barrier layers is disposed on boundary surfaces between the adjacent insulating interlayer patterns and between the trench contact and the insulating interlayer pattern adjacent to the trench contact. The diffusion barrier layer prevents metal of the trench contact from diffusing into the adjacent insulating interlayer. An anti-oxidation layer may be disposed under the diffusion barrier layer so as to prevent the trench contact from being oxidized.

In this embodiment, the insulating interlayer structure includes four insulating interlayers that are vertically stacked on the lower insulation layer 130.

A first anti-oxidation layer 142 is disposed on the lower insulation layer 130. The first anti-oxidation layer 142 may included a silicon nitride layer having a thickness below about 30 Å. A first diffusion barrier layer 144 is disposed on the first anti-oxidation layer 142, and a first insulating interlayer 150 is disposed on the first diffusion barrier layer 144. The first diffusion barrier layer 144 stops etching of the first insulating interlayer 150 for forming a via-hole in a subsequent process, and prevents the metal material of a lower trench contact 160 disposed along the lower trench from diffusing into the first insulating interlayer 150. In this embodiment, the first diffusion barrier layer 144 includes aluminum oxide having a thickness of about 100 Å to about 500 Å, e.g., about 200 Å to about 300 Å. When aluminum oxide is deposited by using the ALD process or by using a source gas including oxygen without reaction gas, the metal is not significantly oxidized, and the first anti-oxidation layer 142 may not be necessary.

The aluminum oxide layer has a high etching selectivity with respect to the silicon oxide and high light transmittance.

According to an article by D. H. Kwo et al., Thin Solid Films 398–399 (2001) 35–40, when aluminum oxide is deposited to a thickness between 0.35 μm and 2 μm using a metal-organic chemical vapor deposition (MOCVD) at a temperature of 350° C. to 500° C., the light transmittance of the aluminum oxide is over 80% in a region of visible light having wavelengths between 400 nm and 700 nm. In addition, according to an article by Lide Zhang, NanoStructured Materials Vol. 8 No. 2 191–197 (1997), when aluminum oxide is deposited using the Sol-Gel process, the light transmittance of the aluminum oxide increases as the temperature of the following heat treatment increases. For example, while the light transmittance of an aluminum oxide layer having a thickness of 7 μm on which no heat treatment is carried out is about 80%, the light transmittance of an aluminum oxide layer having a thickness of 3 μm on which the heat treatment is carried out at a temperature of 400° C. is about 87%.

Therefore, although the aluminum oxide layer is in the optical path of the photodectector, most of external light is transmited by the aluminum oxide layer and reaches the photodetector, thereby improving a performance of the image device including the photodetector.

The first insulating interlayer layer 150 includes a transparent material such as silicon oxide, and a portion of the first insulating interlayer 150 is removed, thereby forming a plurality of openings for exposing the lower contact 140. These openings are a lower trench. The lower trench is filled with metal, e.g., copper, thereby forming a lower trench contact 160 making electrical contact with the lower contact 140. Furthermore, a first barrier metal layer pattern 165 may be disposed around the lower trench contact 160 to prevent metal in the lower trench contact 160 from diffusing into the first insulating interlayer 150.

A second anti-oxidation layer 166 and a second diffusion barrier layer 168 are disposed on the first insulating interlayer 150, and a second insulating interlayer 170 is disposed on the second diffusion barrier layer 168.

As an exemplary embodiment, the second insulating interlayer 170 includes a first lower layer 170a disposed at a lower portion thereof and a first upper layer 170b disposed at an upper portion thereof. A portion of the first lower layer 170a is removed, thereby forming a plurality of first via-holes for exposing the lower conductive line 160. A portion of the first upper layer 170b is also removed, thereby forming a plurality of first trenches connected to the first via-holes, respectively. A first etching stop layer 180 is disposed between the first lower and upper layers 170a and 170b, and is used to stop the etching of the first upper layer 170b for forming the first trench. Therefore, the first trench is formed to be larger than the first via-hole, and the first trench and the first via-hole have a stepped cross-section. The first etching stop layer 180 may include aluminum oxide having a thickness of about 300 Å to 1000 Å, .e.g., about 500 Å to about 700 Å.

The first trenches and via-holes are filled with metal, e.g., copper, thereby forming a first metal pattern 200 acting as a first electrical interconnection. In detail, the first metal pattern 200 includes a first via contact 200a disposed along the first via-holes and making electrical contact with the lower trench contact 160, and a first trench contact 200b disposed along the first trenches making electrical contact with the first via contact 200a.

A second barrier metal layer pattern 190 is coated on inner surfaces of the first trench and via-holes to prevent metal from diffusing into the second insulating interlayer 170. The second barrier metal layer pattern 190 may include titanium nitride or tantalum nitride.

A third anti-oxidation layer 202, a third diffusion barrier layer 204 and a third insulating interlayer 210 are sequentially disposed on the second insulating interlayer 170 in the same structure described above. Therefore, the third insulating interlayer 210 includes a second lower layer 210a disposed at a lower portion thereof and a second upper layer 210b disposed at an upper portion thereof. A portion of the second lower layer 210a is removed, thereby forming a plurality of second via-holes for exposing the first trench contact 200b. A portion of the second upper layer 210b is also removed, thereby forming a plurality of second trenches connected to the second via-holes, respectively. A second etching stop layer 220 is disposed between the second lower and upper layers 210a and 210b, and is used to stop the etching to the second upper layer 210b for forming the second trench. Therefore, the second trench is formed to be wider than the second via-hole, and the second trench and via-hole also have a stepped cross-section.

The second trenches and via-holes are filled with metal, e.g., copper, thereby forming a second metal pattern 230 acting as a second electrical interconnection. In detail, the second metal pattern 230 includes a second via contact 230a disposed along the second via-holes and making electrical contact with the first trench contact 200b, and a second trench contact 230b disposed along the second trenches making electrical contact with the second via contact 230a.

A third barrier metal layer pattern 245 is provided on inner surfaces of the second trench and via-holes to prevent metal therein from diffusing into the third insulating interlayer 210. The third barrier metal layer pattern 245 may also includes titanium nitride or tantalum nitride.

A fourth anti-oxidation layer 232, a fourth diffusion barrier layer 234 and a fourth insulating interlayer 250 are sequentially disposed on the third insulating interlayer 210 in the same structure described above. Therefore, the fourth insulating interlayer 250 includes a third lower layer 250a disposed at a lower portion thereof and a third upper layer 250b disposed at an upper portion thereof. A portion of the third lower layer 250a is removed, thereby forming a plurality of third via-holes for exposing the second trench contact 230b. A portion of the third upper layer 250b is also removed, thereby forming a plurality of third trenches connected to the third via-holes. A third etching stop layer 240 is disposed between the third lower and upper layers 250a and 250b, used to stop the etching to the third upper layer 250b for forming the third trench. Therefore, the third trench is formed to be wider than the third via-hole, and the third trench and via-hole also have a stepped cross-section.

The third trenches and via-holes are filled with metal, e.g., copper, thereby forming a third metal pattern 270 acting as a third electrical interconnection. In detail, the third metal pattern 270 includes a third via contact 270a disposed along the third via-holes and making an electrical contact with the second trench contact 230b, and a third trench contact 270b disposed along the third trenches making electrical contact with the third via contact 270a.

A fourth barrier metal layer pattern 260 is provided on inner surfaces of the third trenches and via-holes to prevent metal therein from diffusing into the fourth insulating interlayer 250. The fourth barrier metal layer pattern 260 may also include titanium nitride or tantalum nitride.

A fifth anti-oxidation layer 272, a fifth diffusion barrier layer 274 and a fifth insulating interlayer 280 are sequentially disposed on the fourth insulating interlayer 250 and the third metal pattern 270.

A color filter 290 is positioned on the fifth insulating interlayer 280 corresponding to the photo diode 110. A lens 300, e.g., a micro-lens, is disposed on the color filter 290 to focus light onto the photo diode 110.

According to the present invention, a metal oxide layer having a high light transmittance is used as an etching stop layer of the image device, so that most of the external light may reach the photo diode, even when the metal oxide layer is in the optical path of the photo diode. In addition, the anti-oxidation layer may include silicon nitride having a thickness of less than about 30 Å, so that the light transmittance may be remarkably increased. Furthermore, the metal oxide layer has a high etching selectivity in respective to the insulating interlayer and an excellent metal diffusion prevention characteristic. Thus, the metal oxide layer may be formed to be thinner than a conventional silicon nitride layer. As a result, parasitic capacitance of electrical interconnections due to the etching stop layer may be significantly improved.

FIGS. 4A to 4M illustrate cross-sections of various stages in a method of manufacturing the image device according to the present invention.

Figure 4A:
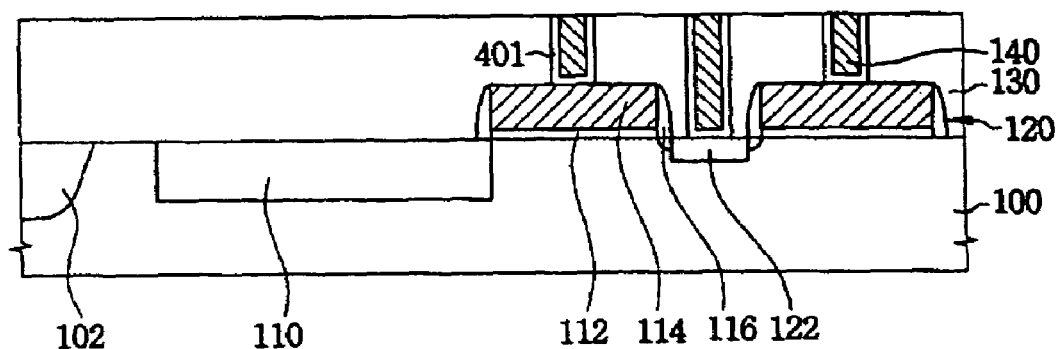
FIGS. 4A to 4M illustrate cross-sectional views of various stages in a method of fabricating the image device according to the present invention.

Referring to FIG. 4A, an active region is defined by forming the field oxide 102 on the semiconductor substrate 100. A photodetector, e.g., a photo diode 110 is provided on a surface of the active region, and the plurality of transistors 120 is formed on the semiconductor substrate 100. The transistors 120 are electrically connected to the photo diode 110 and act as a switching device. Each of the transistors 120 includes the gate electrode 114 and the source/drain region 122. The gate electrode 114 is disposed on the gate insulation layer 112 coated on the semiconductor substrate 100, and the source/drain region 122 is formed at the surface portions of the substrate 100 between the gate electrodes 114. The spacer 116 is formed at both sidewalls of the gate electrode 114.

The lower insulation layer 130 including a transparent material such as silicon oxide is provided on the semiconductor substrate 100 to cover the transistors 120. A portion of the lower insulation layer 130 is removed by a conventional photolithography process, thereby forming a plurality of contact holes for exposing the source/drain region 122 and a portion of the gate electrode 114.

Then, a lower barrier metal layer is provided on inner surfaces of the contact holes and on an upper surface of the lower insulation layer 130 to a thickness of about 100 Å to about 500 Å. The lower barrier metal layer prevents a metal material with which the contact hole is to be filled from diffusing into the lower insulation layer 130. The lower barrier metal layer may include as tantalum nitride or titanium nitride. As described above, when the lower contact holes are filled with titanium, the lower barrier metal layer may not be needed.

The contact holes are filled with a metal by a deposition process such as a CVD process or a sputtering process, thereby forming a lower metal layer on the lower insulation layer 130. The lower metal layer may include titanium and tungsten instead of copper, since copper is likely to diffuse into the semiconductor substrate 100.

The lower metal layer and the lower barrier metal layer are polished until the lower insulation layer 130 is exposed, e.g., by a chemical mechanical polishing (CMP) process, thereby forming the lower contact 140 filling the contact holes and the lower barrier metal layer pattern 401 surrounding the lower contact 140. Therefore, the lower contact 140 is electrically connected to the transistors 120.

Figure 4B:
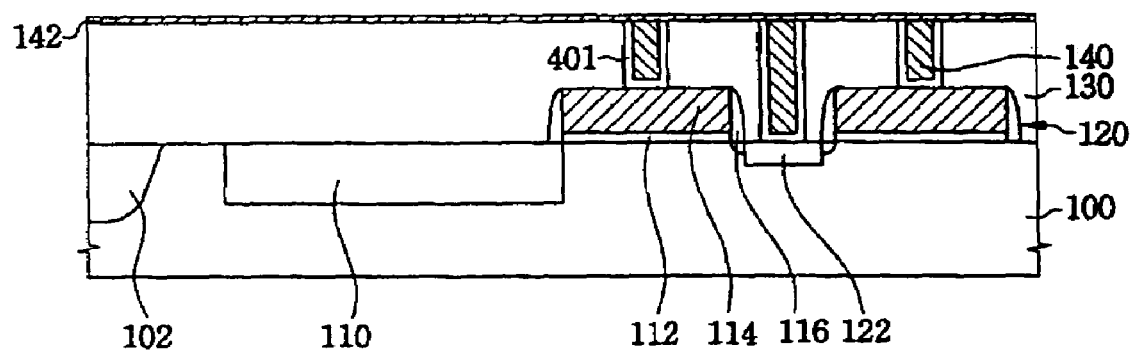

Referring to FIG. 4B, a first anti-oxidation layer 142 including, e.g., silicon nitride or silicon carbide, is provided on the lower insulation layer 130 and the lower contact 140 to prevent the lower contact 140 from being oxidized during a subsequent process. The first anti-oxidation layer 142 may be formed to a thickness of below about 30 Å. The first anti-oxidation layer 142 may include a metal material of low light transmittance. Thus, if the first anti-oxidation layer 142 is too thick, light may be prevented from reaching the photo diode 110, thereby causing a functional failure of the image device.

Figure 4C:
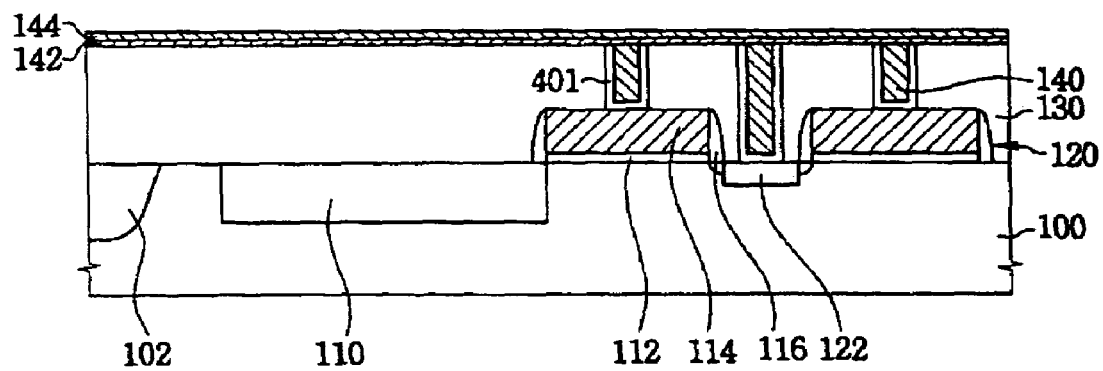

Referring to FIG. 4C, the lower diffusion barrier layer 144 including aluminum oxide is provided on the first anti-oxidation layer 142 to stop an etching process carried out in a subsequent process and to prevent metal from diffusing into an insulating interlayer.

The lower diffusion barrier layer 144 is provided to a thickness of about 100 Å to 500 Å, e.g., about 200 Å to 300 Å. According to a conventional method, the first diffusion barrier layer includes silicon nitride rather than aluminum oxide of an embodiment of the present invention. However, the silicon nitride layer needs to have a thickness greater than about 1000 Å in order to prevent the diffusion of the copper and stop a subsequent etching process. In contrast, experimental results show that a thickness of about 200 Å is sufficient for the same diffusion prevention and etching stop when aluminum oxide is used. Thus, use of aluminum oxide in accordance with an embodiment of the present invention may reduce the thickness to as much as about 80% of that of the conventional diffusion barrier layer. The aluminum oxide may be provided using a PVD process, a CVD process, an ALD process or a Sol-Gel process.

The light transmittance of the aluminum oxide layer is dependent on the layer thickness and the layer composition. That is, the more uniform the composition of the aluminum oxide layer and the fewer impurities in the aluminum oxide layer, the better the light transmittance. Therefore, the aluminum oxide layer may be provided using an ALD or a PEALD process to ensure uniform composition and few impurities. When aluminum oxide is provided using the ALD process, the first anti-oxidation layer 142 is not necessarily needed, since the metal is barely oxidized during this type of deposition process.

The aluminum oxide layer is coated to be thinner than a conventional silicon nitride layer, thus reducing parasitic capacitance as compared with the silicon nitride layer. In addition, most of the light is transmitted through the aluminum oxide, and reaches the photodetector, thereby improving the performance of the image device.

A plurality of insulating interlayers is formed on the lower diffusion barrier layer 144. Each of the insulating interlayers includes at least a recessed portion, e.g., a trench and a via-hole. In this embodiment, four insulating interlayers are vertically stacked on the lower diffusion barrier layer 144. Hereinafter, the stacked insulating interlayer will be described.

Figure 4D:
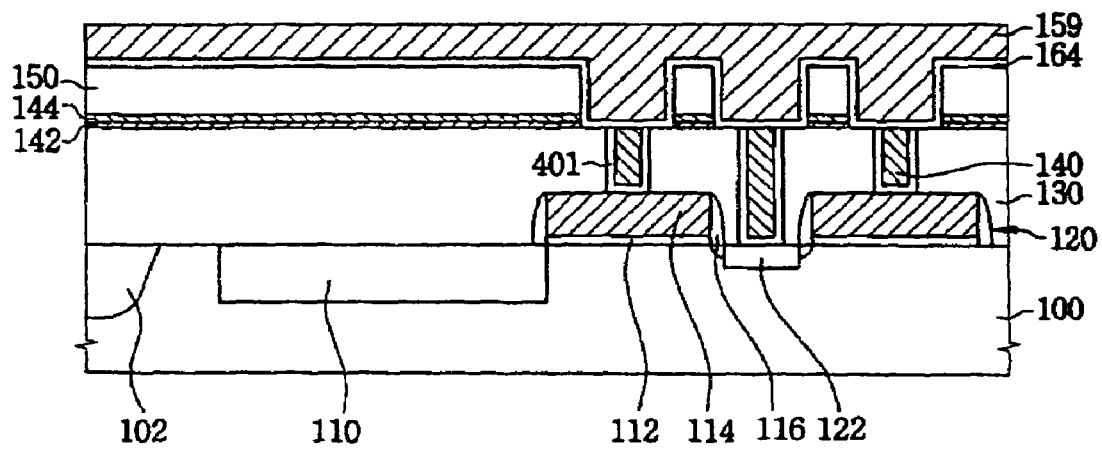

Referring to FIG. 4D, the first insulating interlayer 150 including silicon oxide is provided on the first diffusion barrier layer 144.

A portion of the first insulating interlayer 150, the first diffusion barrier layer 144 and the first anti-oxidation layer 142 are sequentially removed to form a lower trench for exposing a portion of the lower contact 140. A first barrier metal layer 164 having a thickness, for example, of about 100 Å to 500 Å, is provided on inner surfaces of the lower trench and on the first insulating interlayer 150. The first barrier metal layer 164 prevents metal to be provided in the lower trench from diffusing into the first insulating interlayer 150.

Then, metal is deposited on the first insulating interlayer 150 to a predetermined thickness, filling the lower trench up with the copper. As a result, a first metal layer 159 is provided on the first insulating interlayer 150. The metal layer may be provided using an electroplating process after depositing a metal seed by a sputtering process, or using an electroless plating process.

Figure 4E:
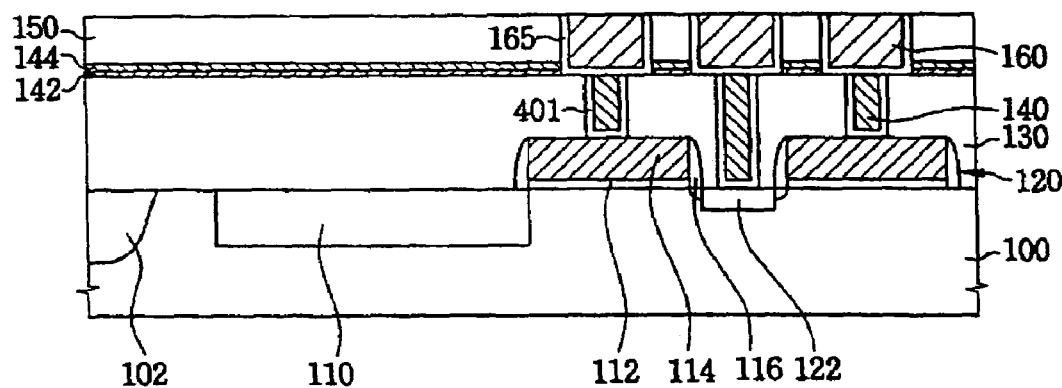

Referring to FIG. 4E, the first metal layer 159 and the first barrier metal layer 164 are removed from the first insulating interlayer, e.g., using a CMP process. Thus, the first insulating interlayer 150 is exposed, and only the lower trench is filled with metal. Therefore, the lower trench contact 160 is formed along the lower trench, and is electrically connected with the lower contact 140. In addition, the first barrier metal layer 164 remains on side surfaces and bottom surface of the lower trench, thereby forming the first barrier metal layer pattern 165. The first barrier metal layer pattern 165 prevents the metal of the lower trench contact 160 from diffusing into the first insulating interlayer 150.

Figure 4F:
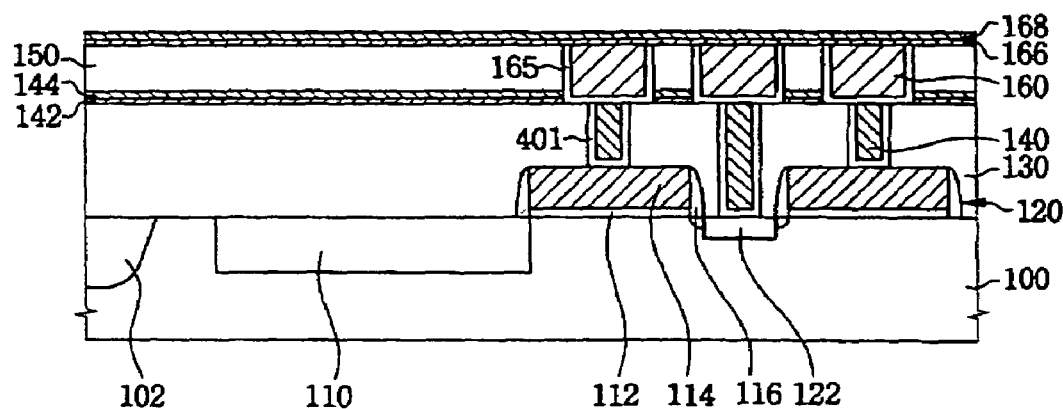

Referring to FIG. 4F, a second anti-oxidation layer 166 and a second diffusion barrier layer 168 are sequentially coated on the first insulating interlayer 150 and the lower trench contact 160. The second anti-oxidation layer 166 prevents the lower trench contact 160 from being oxidized. The second anti-oxidation layer 166 may include silicon nitride or silicon carbide having a thickness below about 30 Å. In this embodiment, the second diffusion barrier layer 168 includes aluminum oxide at a thickness of about 100 Å to about 500 Å, e.g., a thickness of about 200 Å to about 300 Å.

Figure 4G:
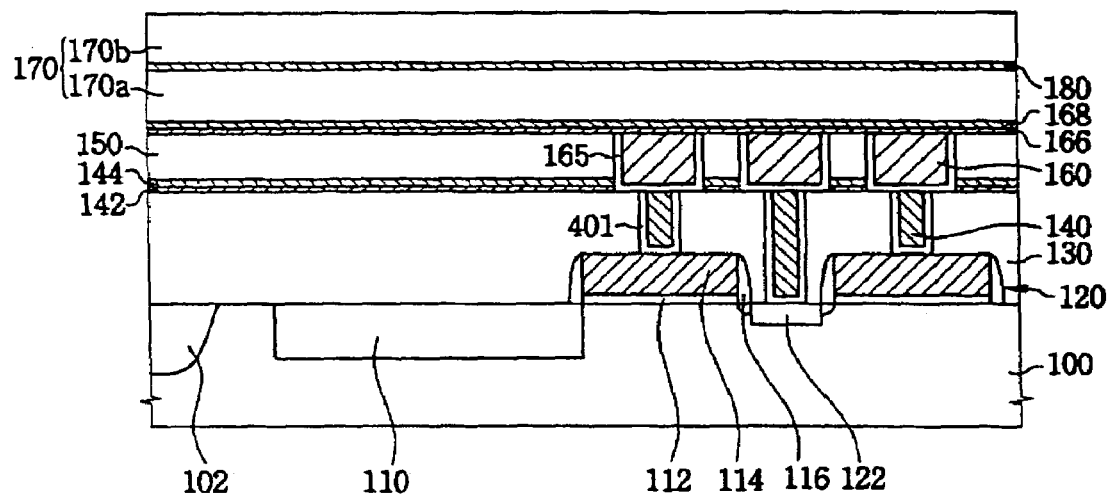

Referring to FIG. 4G, the second insulating interlayer 170 is coated on the second diffusion barrier layer 168. As an exemplary embodiment, the second insulating interlayer 170 includes the first lower layer 170a and the second upper layer 170b. The first lower layer 170a is provided on the second diffusion barrier layer 168, and may include a silicon oxide type material. Then, the first etching stop layer 180, e.g., including aluminum oxide, is provided on the first lower layer 170a, and is used to stop a subsequent etching process for forming a trench in the first upper layer 170b. The etching stop layer 180 may have a thickness of about 300 Å to about 1000 Å, e.g., about 500 Å to about 700 Å. The first upper layer 170b coated on the etching stop layer 180 includes a silicon oxide type material.

Figure 4H:
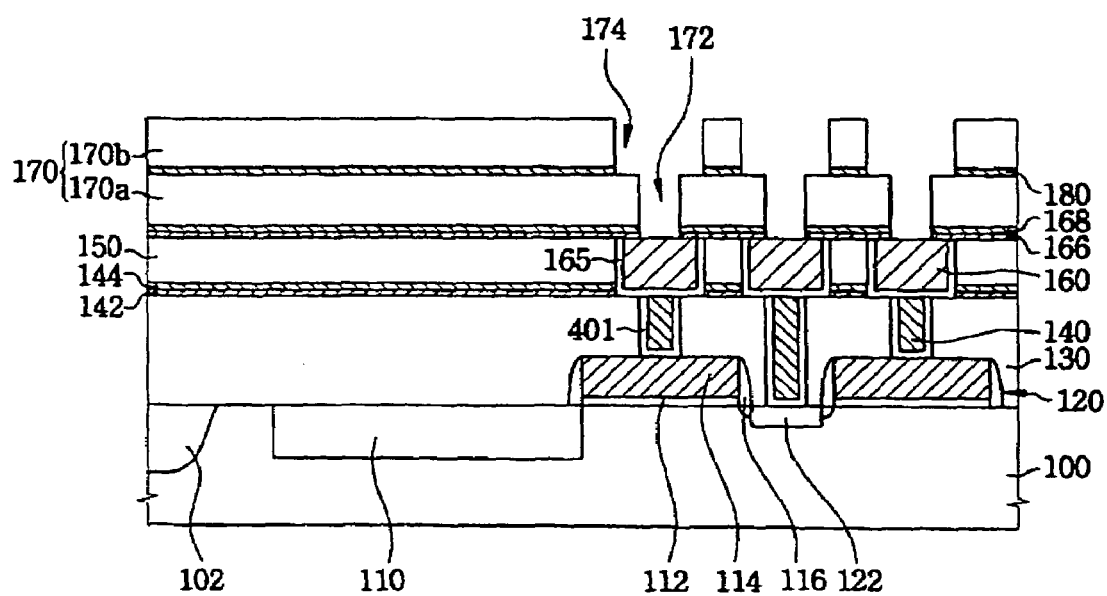

Referring to FIG. 4H, the first upper layer 170b, the etching stop layer 180 and the first lower layer 170a are sequentially removed, respectively, by a conventional photolithography process, thereby exposing a portion of the second diffusion barrier layer 168 and forming a first space surrounded by the first lower layer 170a, the etching stop layer 180 and the first upper layer 170b. Next, an etching process is performed on the first upper layer 170b neighboring the first space until the etching stop layer 180 is exposed. In other words, the etching stop layer 180 is used to stop the etching process for removing part of the first upper layer 170b, and thus the first lower layer 170a is protected during this etching process. Therefore, the first lower and upper layers 170a and 170b are formed to have a stepped cross-section shape, with a second space wider than the first space. The second diffusion barrier layer 168 has a higher etching selectivity than that of the first upper layer 170b, thus the second diffusion barrier layer 168 is barely etched in the etching process for forming the second space. Therefore, the lower trench contact 160 is not exposed in the etching process for forming the second space, thereby protecting the lower copper line 160.

Then, the etching stop layer 180 exposed in the second space and the second diffusion barrier layer 168 exposed in the first space are removed, and the lower trench contact 160 is exposed as shown in FIG. 4H. Therefore, the first space is defined by the lower trench contact 160 and the first lower layer 170a, and the second space is defined by the first lower and upper layers 170a and 170b and is connected to the first space. The first space serves as a first via-hole 172 and the second space serves as a first trench 174. Although the above exemplary embodiments discuss a via-first damascene process in which a via-hole is formed prior to the trench, any other process for forming the via-hole and trench such as a trench-first damascene in which a trench is formed prior to the via-hole may also be utilized in place of the via-first damascene process, as would be known to one of the ordinary skill in the art.

Figure 4I:
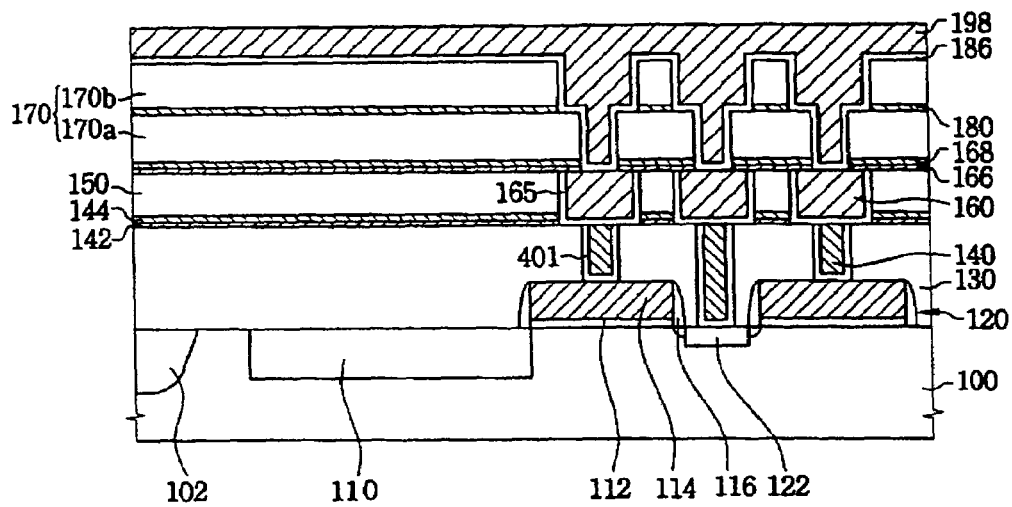

Referring to FIG. 4I, a first barrier metal layer 186 is formed on inner surfaces of the first via-hole 172 and the first trench 174, and on the first upper layer 170b. The barrier metal layer 186 prevents a metal, e.g., copper, which fills the first via-hole 172 and the first trench 174, from diffusing into the second insulating interlayer 170. The first barrier metal layer 186 may include a tantalum layer, a tantalum nitride layer or a composite layer of titanium nitride layer coated on the tantalum layer. Metal is deposited on the first upper layer 170b to a predetermined thickness, so that the first via-hole 172 and the first trench 174 are filled with metal. As a result, a metal layer 198 is on the first upper layer 170b. The metal layer 198 may be formed using an electroplating process after depositing a metal seed by sputtering process, or using an electroless plating process.

Figure 4J:
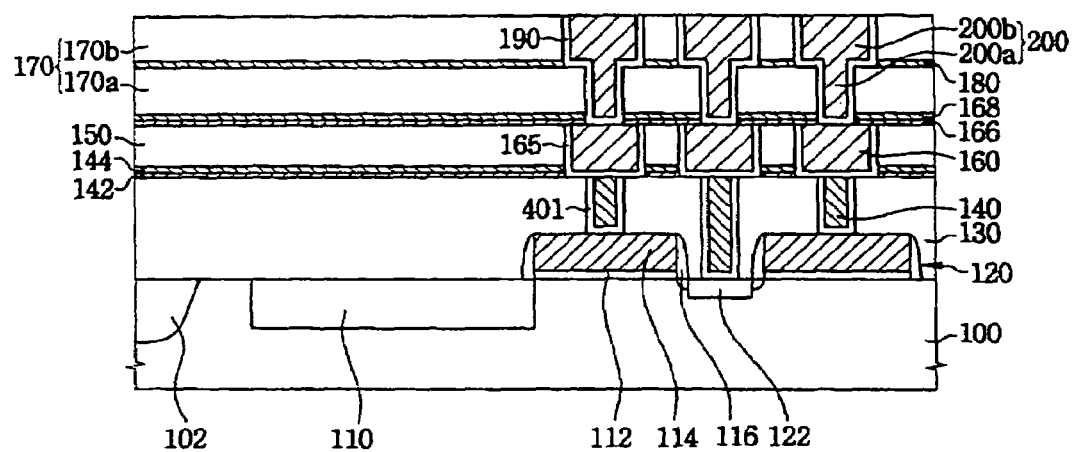

Referring to FIG. 4J, the metal layer 198 and the first barrier metal layer 186 are removed, e.g., using a chemical mechanical polishing (CMP) process, thus exposing the first upper layer 170b. Therefore, the metal only remains in the first via-hole 172 and the first trench 174, thereby forming the first metal pattern 200. The first metal pattern 200 includes the first via contact 200a electrically connected with the lower trench contact 160 and a first trench contact 200b electrically connected to the first via contact 200a and supplying an electrical signal to the first via contact 200a. In addition, the barrier metal layer 186 remains on side surfaces of the first upper and lower layers 170a and 170b and on the lower copper line 160, thereby forming the first barrier metal layer pattern 190.

Figure 4K:
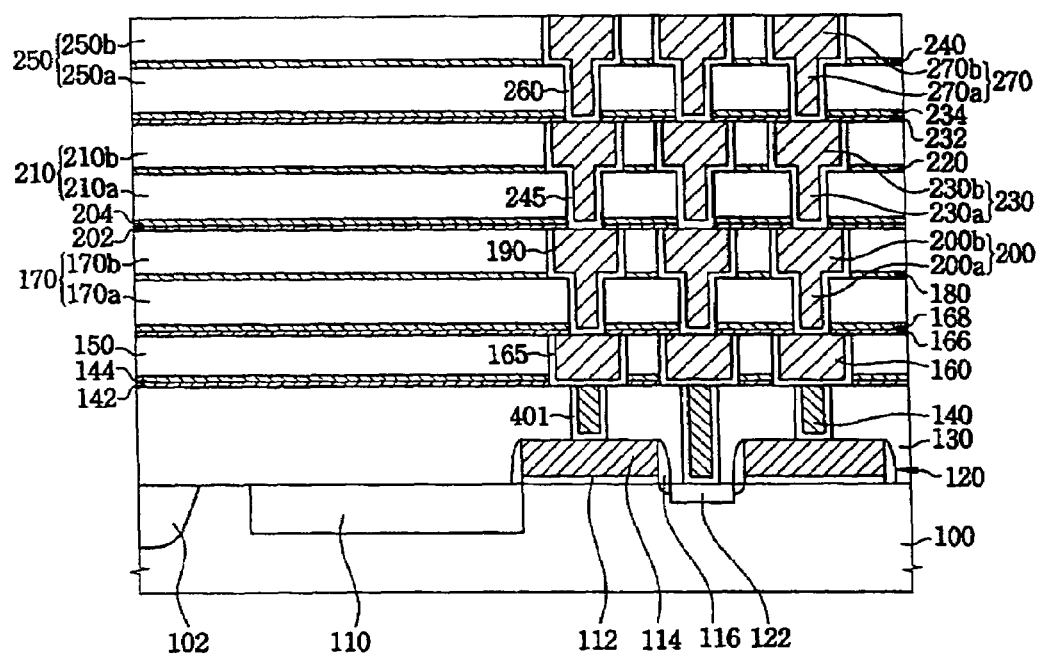

Referring to FIG. 4K, the insulating interlayer and the first metal pattern may be vertically stacked thereon by repeating the processes as described above in relation to FIGS. 4F to 4J. Therefore, the insulating interlayer is formed into stacked layers, each of which includes a lower layer and an upper layer, and the second metal pattern is also formed into stacked patterns individually positioned in every second insulation layer.

The third anti-oxidation layer 202 and the third diffusion barrier layer 204 are sequentially provided on the first upper layer 170b and the first trench contact 200b. Then, the second lower layer 210a, the second etching stop layer 220 and the second upper layer 210b are sequentially coated on the third diffusion barrier layer 204. The third anti-oxidation layer 202, the third diffusion barrier layer 204 and the second lower layer 210a are sequentially partially removed, forming a second via-hole. The second via-hole is filled with metal, thereby forming the second via contact 230a electrically connected with the first trench contact 200b. In the same manner as above, the second etching stop layer 220 and the second upper layer 210b are sequentially and partially removed, forming a second trench. The second trench is also filled with metal, thereby forming the second trench contact 230b making a contact with the second via contact 230a. The second via contact 230a and the second trench contact 230b may be formed by a dual damascene process.

The fourth anti-oxidation layer 232 and the fourth diffusion barrier layer 234 are sequentially coated on the second upper layer 210b and the second trench contact 230b. Then, the third lower layer 250a, the third etching stop layer 240 and the third upper layer 250b are sequentially coated on the fourth diffusion barrier layer 234. The fourth anti-oxidation layer 232, the fourth diffusion barrier layer 234 and the third lower layer 250a are sequentially and partially removed, forming a third via-hole. The third via-hole is filled with metal, thereby forming the third via contact 270a electrically connected with the second trench contact 230b. In the same manner as above, the third etching stop layer 240 and the third upper layer 250b are sequentially and partially removed, and a third trench is formed. The third trench is also filled with metal, thereby forming the third trench contact 270b electrically connected to the third via contact 270a. The third via contact 270a and the third trench contact 270b may also formed by a dual damascene process.

Figure 4L:
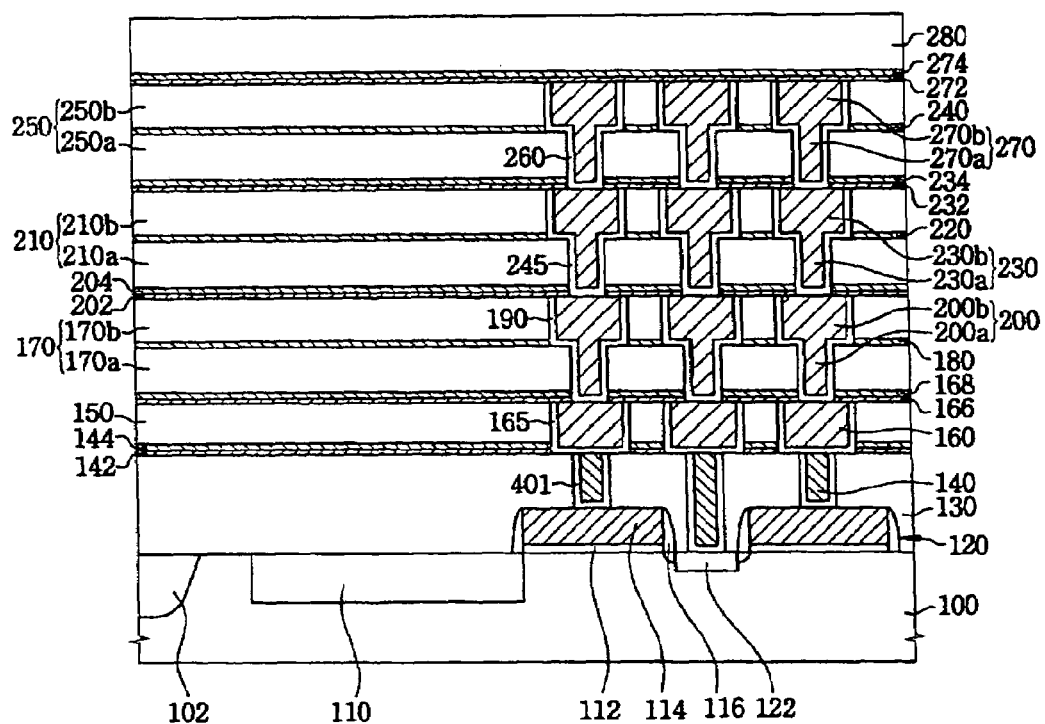

Referring to FIG. 4L, the fifth anti-oxidation layer 272, the fifth diffusion barrier layer 274 and the fifth insulating interlayer 280 are sequentially provided on the third upper layer 250b and the third trench contact 270b.

Figure 4M:
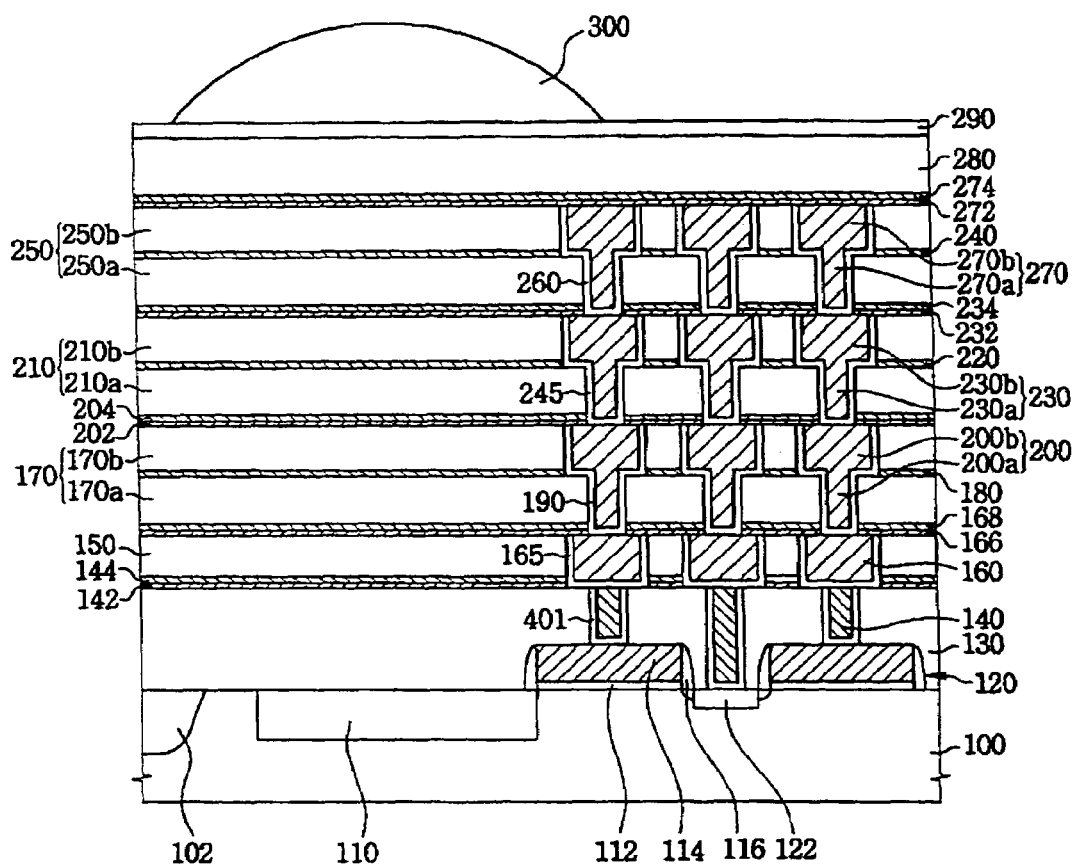

Referring to FIG. 4M, the color filter 290 is formed on the fifth insulating interlayer 280. The color filter 290 may include an array structure of blue, green and red color filters. The micro-lens 300 is formed on the color filter 290 to focus light onto the photo diode 110, thereby completing the image device including a CIS. The micro-lens 300 may have an upward-convex semi-sphere shape.

Experiment on Diffusion Prevention of the Aluminum Oxide

Comparative Sample 1

A silicon oxide layer was coated on a silicon substrate. A silicon nitride layer was coated to a thickness of 1000 Å on the silicon oxide layer as a diffusion barrier layer. Then, copper was deposited on the silicon nitride layer. A heat treatment was carried out to the substrate on which the silicon oxide layer, silicon nitride layer and a copper layer were stacked for 30 minutes at a temperature of 400° C. The copper was then etched by a wet etching process.

Comparative Sample 2

A silicon oxide layer was coated on a silicon substrate. A tantalum oxide layer was coated to a thickness of 400 Å on the silicon oxide layer as a diffusion barrier layer. Then, copper was deposited on the tantalum oxide layer. A heat treatment was carried out to the substrate on which the silicon oxide layer, tantalum oxide layer and a copper layer were stacked for 30 minutes at a temperature of 400° C. in a vacuum state. The copper was etched by a wet etching process.

Sample 1

A silicon oxide layer was coated on a silicon substrate. An aluminum oxide layer was coated to a thickness of 200 Å on the silicon oxide layer as a diffusion barrier layer. Then, copper was deposited on the aluminum oxide layer. A heat treatment was carried out to the substrate on which the silicon oxide layer, aluminum oxide layer and a copper layer were stacked for 30 minutes at a temperature of 400° C. in a vacuum state. The copper was etched by a wet etching process.

Experimental Results on Copper Diffusion with Sample 1, Comparative Samples 1 and 2

Figure 5:
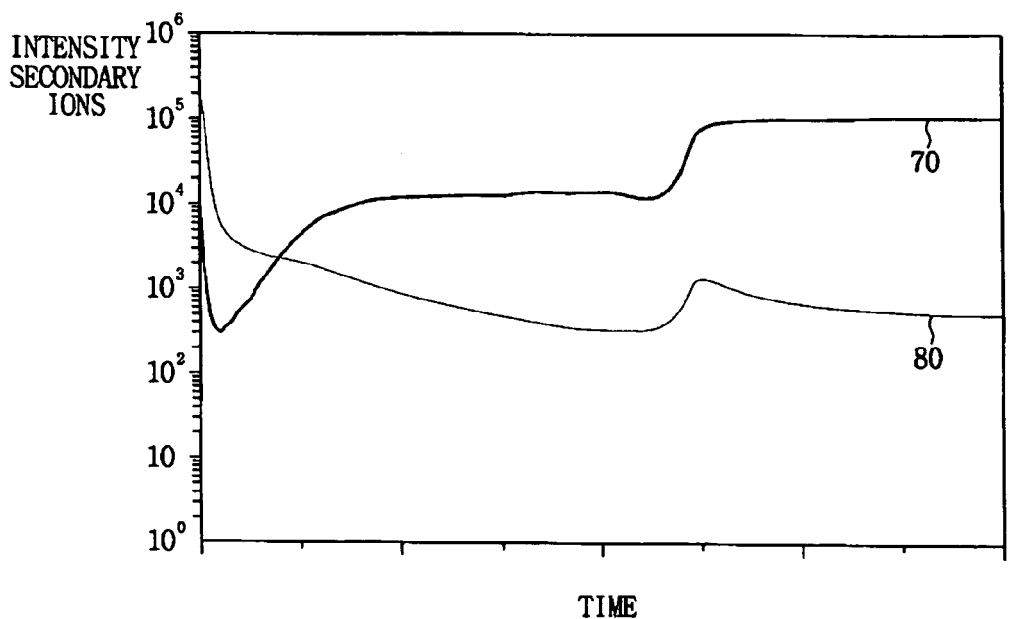
FIG. 5 is a graph of intensity of secondary ions versus time when Comparative Sample 1 is tested.
Figure 6:
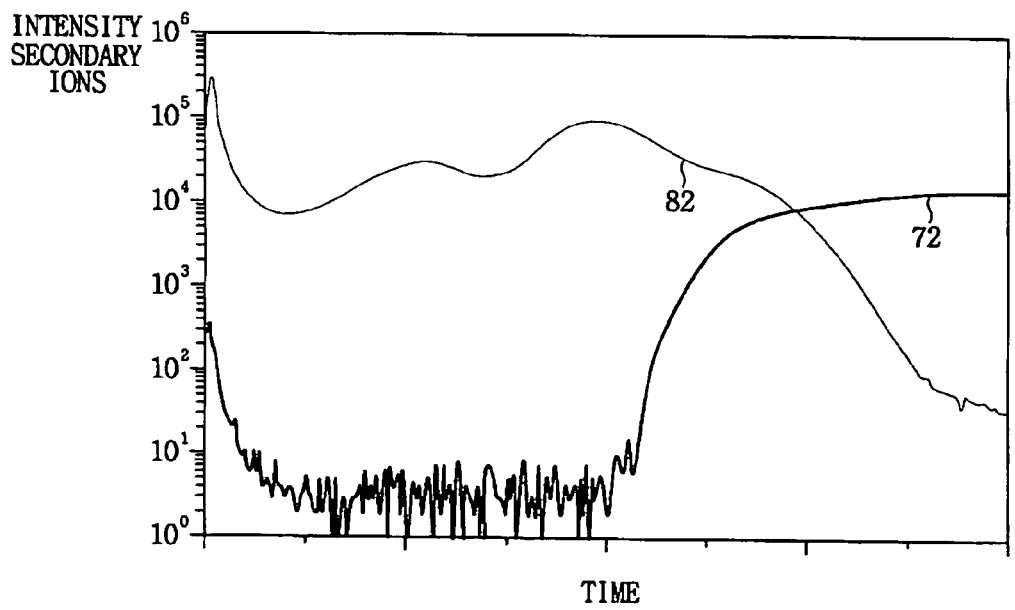
FIG. 6 is a graph of intensity of secondary ions versus time when Comparative Sample 2 is tested.
Figure 7:
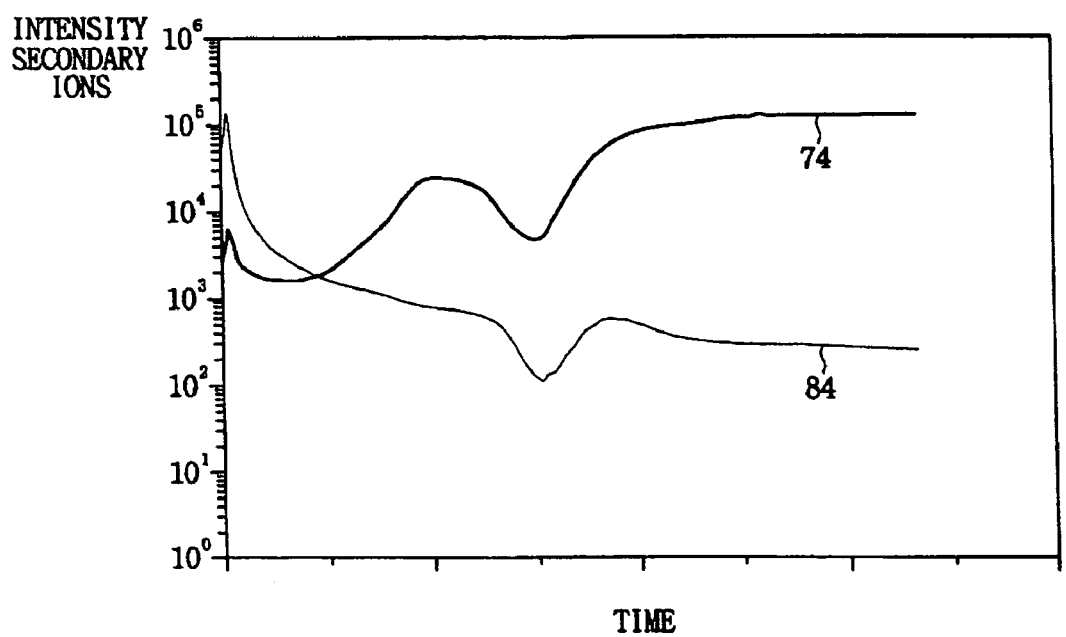
FIG. 7 is a graph of intensity of secondary ions versus time when Sample 1 is tested.

FIG. 5 is a graph of intensity of secondary ions versus time when Comparative Sample 1 was tested. FIG. 6 is a graph of intensity of secondary ions versus time when Comparative Sample 2 was tested. FIG. 7 is a graph of intensity of secondary ions versus time when Sample 1 was tested. In FIGS. 5 trough 7, plots 70, 72, 74 indicate the amount of secondary ions of the silicon, and plots 80, 82, 84 indicate the amount of secondary ions of the copper.

The intensity of secondary ions shown in FIGS. 5 to 7 was measured by secondary ion mass spectrometry (SIMS). The SIMS analysis shows that the amount of copper diffusion into the silicon oxide varies in accordance with a type of diffusion barrier layer.

When the silicon nitride layer is coated to a thickness of about 1000 Å, as in Comparative Sample 1, it is well known that the copper is sufficiently prevented from diffusing. The copper detected in FIG. 5 is not from copper diffusion into the silicon oxide layer, but rather from a copper matrix effect due to copper remaining after removal of the copper by the etching process.

When the tantalum oxide layer is coated to a thickness of about 400 Å, as in Comparative Sample 2, much more copper is detected in the silicon oxide layer than when the silicon nitride layer of about 1000 Å as shown in FIG. 6. Therefore, the copper will diffuse into the silicon oxide layer even with a tantalum oxide layer of about 400 Å as a diffusion barrier layer.

Comparing FIGS. 5 and 7 illustrates that the copper profile in the silicon oxide layer when aluminum oxide layer is coated to a thickness of about 200 Å, as in Sample 1, is very similar to that of the silicon nitride layer having a thickness of about 1000 Å. Therefore, when the aluminum oxide layer is utilized as the diffusion barrier layer in accordance with an embodiment of the present invention, a thickness of about 200 Å is sufficient for preventing the copper from diffusing.

As described above, multi-layer electrical interconnections electrically connected to the transistors may be formed to include metal of low resistance, e.g., copper. Therefore, even when the electrical interconnections are formed using a process having a design rule below 0.13 μm, the electrical resistance of the electrical interconnections may be sufficiently reduced. As a result, the operating speed of the image device may be remarkably increased. In addition, light sufficiently reaches the photo diode, since the diffusion barrier layer formed of aluminum oxide has a high light transmittance. Therefore, the light transmittance of the CIS may be remarkably improved.

According to the exemplary embodiments of the present invention, the wirings of the CIS may be formed of copper, and aluminum oxide layer having high light transmittance is used as the etching stop layer in the copper damascene process. Therefore, although the image sensor may be manufactured under the process below 0.13 μm, the CIS still has sufficient light transmittance.

Although exemplary embodiments of the present invention have been described, it is understood that the present invention should not be limited to these exemplary embodiments but various changes and modifications can be made by one skilled in the art within the spirit and scope of the present invention as hereinafter claimed. For example, similar advantages of using a metal oxide with high light transmittance over any optoelectronic device, such as a light source, may be realized.

What is claimed is:

1. A method of forming an electrical interconnection, comprising:

forming a first insulation layer on a semiconductor substrate;

forming at least a first recessed portion in the first insulation layer;

filling the first recessed portion with metal to form a first metal pattern;

forming a metal anti-oxidation layer on the first insulation layer and the first metal pattern, the metal anti-oxidation layer preventing the first metal pattern from being oxidized;

forming a first diffusion barrier layer on the metal anti-oxidation layer, the first metal pattern and the first insulation layer, the first diffusion barrier layer including a metal oxide and preventing metal of the first metal pattern from diffusing out of the first metal pattern;

forming a second insulation layer on the first diffusion barrier layer;

forming at least a second recessed portion in the second insulation layer, the second recessed portion exposing a portion of the first metal pattern; and filling the second recessed portion with metal to form a second metal pattern, wherein the metal anti-oxidation layer is formed before the first diffusion barrier layer to be under the first diffusion barrier layer.

2. The method of forming an electrical interconnection as claimed in 1, wherein the first diffusion barrier layer is formed by depositing aluminum oxide.

3. The method of forming an electrical interconnection as claimed in claim 2, wherein the aluminum oxide is deposited by a physical vapor deposition (PVD) process, a chemical vapor deposition (CVD) process, an atomic layer deposition (ALD) or a Sol-Gel process.

4. The method of forming an electrical interconnection as claimed in claim 1, wherein forming a second insulation layer comprises:

forming a lower layer on the first diffusion barrier layer;

forming an etching stop layer for stopping an etching process on the lower layer; and forming an upper layer on the etching stop layer.

5. The method of forming an electrical interconnection as claimed in claim 4, wherein forming a second recessed portion comprises:

selectively removing the upper layer, the etching stop layer and the lower layer, thereby forming a space surrounded by the upper layer, the etching stop layer and the lower layer and exposing a portion of the first diffusion barrier layer;

removing the upper layer neighboring the space, thereby exposing a portion of the etching stop layer; and removing the exposed etching stop layer and the first diffusion barrier layer, thereby exposing the first metal pattern.

6. The method of forming an electrical interconnection as claimed in claim 5, wherein forming the second metal pattern comprises:

depositing metal on the upper layer to a predetermined thickness, thereby filling the second recessed portion with metal and forming a metal layer; and planarizing the metal layer, thereby exposing a surface of the upper layer.

7. The method of forming an electrical interconnection as claimed in claim 6, wherein forming the second insulation layer, forming the second recessed portion and forming the second metal pattern are sequentially repeated, thereby forming a plurality of the second insulation layers vertically stacked thereon and a plurality of the second metal patterns disposed in each of the second insulation layers.

8. The method of forming an electrical interconnection as claimed in claim 7, further comprising forming at least a second diffusion barrier layer on a boundary region of the second insulation layers, the second diffusion barrier for layer preventing metal from diffusing from the second metal pattern.

9. The method of forming an electrical interconnection as claimed in claim 8, wherein the second diffusion layer is formed by a physical vapor deposition (PVD) process, a chemical vapor deposition (CVD) process, an atomic layer deposition (ALD) or a Sol-Gel process.

10. The method of forming an electrical interconnection as claimed in claim 9, further comprising forming another metal anti-oxidation layer under the second diffusion barrier layer, the another metal anti-oxidation layer preventing the second metal pattern from being oxidized.

11. The method of forming an electrical interconnection as claimed in claim 4, wherein forming the etching stop layer includes depositing aluminum oxide on the lower layer.

12. A method of manufacturing an image device, comprising:

forming a semiconductor device including an optoelectronic device on the semiconductor substrate;

forming a lower insulation layer including a first metal pattern on the semiconductor substrate, the first metal pattern being electrically connected with the semiconductor device;

forming a lower diffusion barrier layer on the lower insulation layer, the lower diffusion barrier layer including metal oxide and preventing metal of the first metal pattern from diffusing out of the first metal pattern;

forming at least an insulating interlayer on the lower insulation layer, the insulating interlayer including at least a recessed portion;

filling the recessed portion with metal, thereby forming a second metal pattern;

forming a metal anti-oxidation layer on the insulating interlayer and the second metal pattern, the metal anti-oxidation layer preventing the second metal pattern from being oxidized;

forming an upper diffusion barrier layer on the metal anti-oxidation layer, the second metal pattern and the insulating interlayer, the upper diffusion barrier layer including a metal oxide and preventing metal of the second metal pattern from diffusing out of the second metal pattern;

forming a color filter on the upper diffusion barrier layer; and forming a lens on the color filter, wherein the metal anti-oxidation layer is formed before the first diffusion barrier layer to be under the upper diffusion barrier layer.

13. The method of manufacturing an image device as claimed in claim 12, wherein forming the insulating interlayer includes forming a lower layer having at least a via-hole for exposing the first metal pattern and forming an upper layer having at least a trench connected to the via-hole, and wherein forming the second metal pattern includes forming a via contact including copper along the via-hole and forming a trench contact including copper along the trench.

14. The method of manufacturing an image device as claimed in claim 13, wherein forming the insulating interlayer and forming the second metal pattern are alternatively repeated, so that a plurality of the insulating interlayers is stacked on the lower diffusion barrier layer, each of the plurality of insulating interlayers including a corresponding one of the second metal pattern, the second metal patterns being electrically connected with each other in an order stacked by electrically connecting trench contacts and adjacent via contacts.

15. The method of manufacturing an image device as claimed in claim 14, further comprising forming at least a middle diffusion barrier layer including a metal oxide between at least one of the insulating interlayers and the corresponding, second metal pattern, the middle diffusion barrier layer preventing diffusion of copper from the trench contact.

16. The method of manufacturing an image device as claimed in claim 15, wherein the upper, lower and middle diffusion layers are formed by depositing aluminum oxide.

17. The method of manufacturing an image device as claimed in claim 16, wherein the aluminum oxide is deposited by a physical vapor deposition (PVD) process, a chemical vapor deposition (CVD) process, an atomic layer deposition (ALD) or a Sol-Gel process.

18. The method of manufacturing an image device as claimed in claim 15, further comprising forming an anti-oxidation layer before forming the middle diffusion barrier layer, the anti-oxidation layer preventing the trench contact from being oxidized.

19. The method of manufacturing an image device as claimed in claim 13, further comprising forming an etching stop layer between the lower layer and the upper layer, the etching stop layer being used for stopping an etching process for forming the trench.

20. The method of manufacturing an image device as claimed in claim 19, wherein the etching stop layer is formed by depositing aluminum oxide on the lower layer.

* * * * *